(12) United States Patent
Inatsuka et al.

(10) Patent No.: US 10,797,072 B2
(45) Date of Patent: Oct. 6, 2020

(54) SEMICONDUCTOR DEVICE

(71) Applicant: Toshiba Memory Corporation, Minato-ku (JP)

(72) Inventors: Takuya Inatsuka, Yokkaichi (JP); Taichi Iwasaki, Yokkaichi (JP); Osamu Matsuura, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/281,202

(22) Filed: Feb. 21, 2019

(65) Prior Publication Data

US 2020/0083246 A1 Mar. 12, 2020

(30) Foreign Application Priority Data

Sep. 7, 2018 (JP) ................. 2018-167704

(51) Int. Cl.
*H01L 27/11582* (2017.01)
*H01L 29/36* (2006.01)
*H01L 29/08* (2006.01)
*H01L 29/10* (2006.01)
*H01L 29/49* (2006.01)
(Continued)

(52) U.S. Cl.
CPC .. *H01L 27/11582* (2013.01); *H01L 27/11565* (2013.01); *H01L 27/11568* (2013.01); *H01L 27/11573* (2013.01); *H01L 29/04* (2013.01); *H01L 29/0847* (2013.01); *H01L 29/1037* (2013.01); *H01L 29/167* (2013.01); *H01L 29/36* (2013.01); *H01L 29/4916* (2013.01); *H01L 29/513* (2013.01); *H01L 29/518* (2013.01); *H01L 21/0217* (2013.01); *H01L 21/0273* (2013.01); *H01L 21/02532* (2013.01); *H01L 21/02636* (2013.01); *H01L 21/266* (2013.01); *H01L 21/26513* (2013.01);
(Continued)

(58) Field of Classification Search
CPC ........................ H01L 27/11551–1156; H01L 27/11578–11582; H01L 29/0847
See application file for complete search history.

(56) References Cited

U.S. PATENT DOCUMENTS 6,051,473 A 4/2000 Ishida
7,498,218 B2 3/2009 Ahn
(Continued)

FOREIGN PATENT DOCUMENTS

JP 02-034930 2/1990
JP 2003-249550 9/2003
(Continued)

*Primary Examiner* — Daniel P Shook
(74) *Attorney, Agent, or Firm* — Oblon, McClelland, Maier & Neustadt, L.L.P.

(57) ABSTRACT

A semiconductor device according to an embodiment includes an N-well region, a first gate electrode, a columnar epitaxial layer, and a first contact. The N-well region includes two P-type impurity diffusion regions. The first gate electrode is provided above the N-well region between the two P-type impurity diffusion regions. The first gate electrode are opposed to the N-well region via a gate insulating film. The columnar epitaxial layer is provided on the P-type impurity diffusion region. The epitaxial layer includes a first semiconductor layer including P-type impurities. The first contact is provided on the first semiconductor layer of the epitaxial layer.

26 Claims, 32 Drawing Sheets

(51) Int. Cl.
  *H01L 29/04* (2006.01)
  *H01L 27/11573* (2017.01)
  *H01L 27/11565* (2017.01)
  *H01L 27/11568* (2017.01)
  *H01L 29/51* (2006.01)
  *H01L 29/167* (2006.01)
  *H01L 21/02* (2006.01)
  *H01L 21/266* (2006.01)
  *H01L 21/265* (2006.01)
  *H01L 21/027* (2006.01)
  *H01L 21/324* (2006.01)
  *H01L 21/311* (2006.01)

(52) U.S. Cl.
  CPC ... *H01L 21/31116* (2013.01); *H01L 21/31144* (2013.01); *H01L 21/324* (2013.01)

(56) References Cited

U.S. PATENT DOCUMENTS

| | | |
|---|---|---|
| 8,582,341 B2 | 11/2013 | Fukuzumi et al. |
| 10,355,017 B1* | 7/2019 | Nakatsuji ........ H01L 21/823878 |
| 2012/0168858 A1 | 7/2012 | Hong |
| 2014/0035000 A1 | 2/2014 | Ontalus et al. |
| 2015/0061010 A1 | 3/2015 | Cheng et al. |
| 2019/0348434 A1* | 11/2019 | Shioda .............. H01L 27/11573 |

FOREIGN PATENT DOCUMENTS

| | | |
|---|---|---|
| JP | 2005-354029 | 12/2005 |
| JP | 2013-065604 | 4/2013 |
| JP | 5857690 | 2/2016 |

* cited by examiner

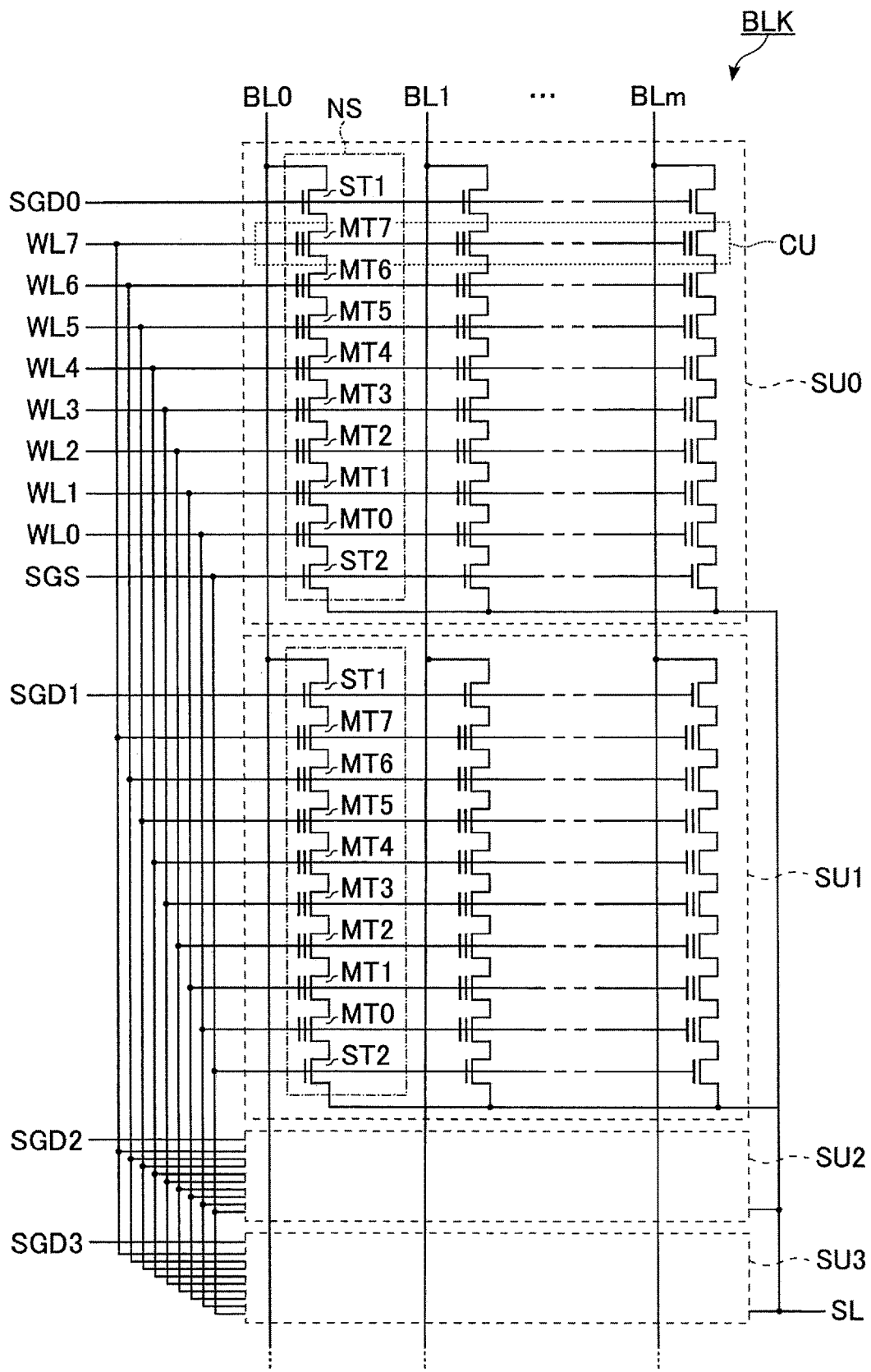
F I G. 2

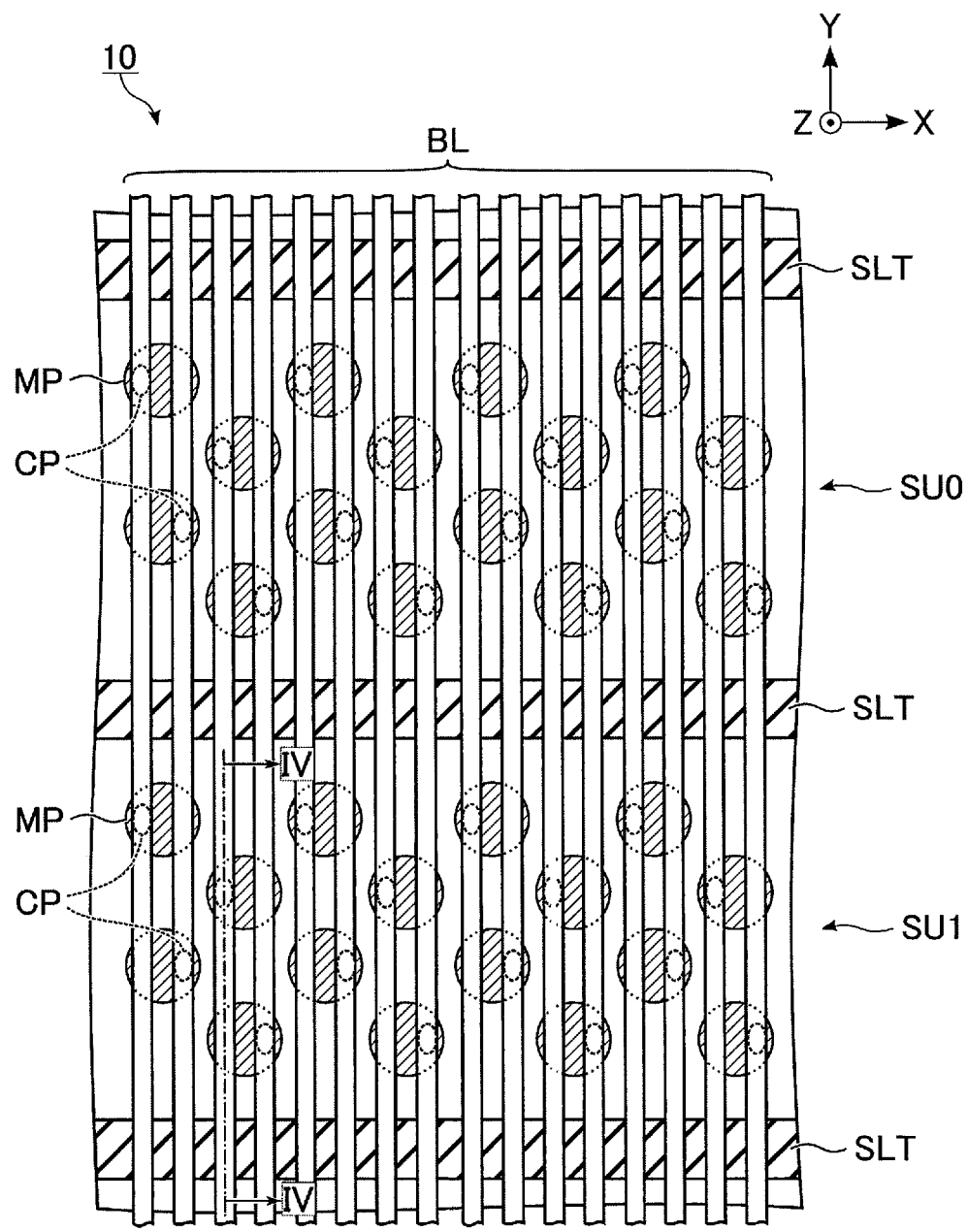
F I G. 3

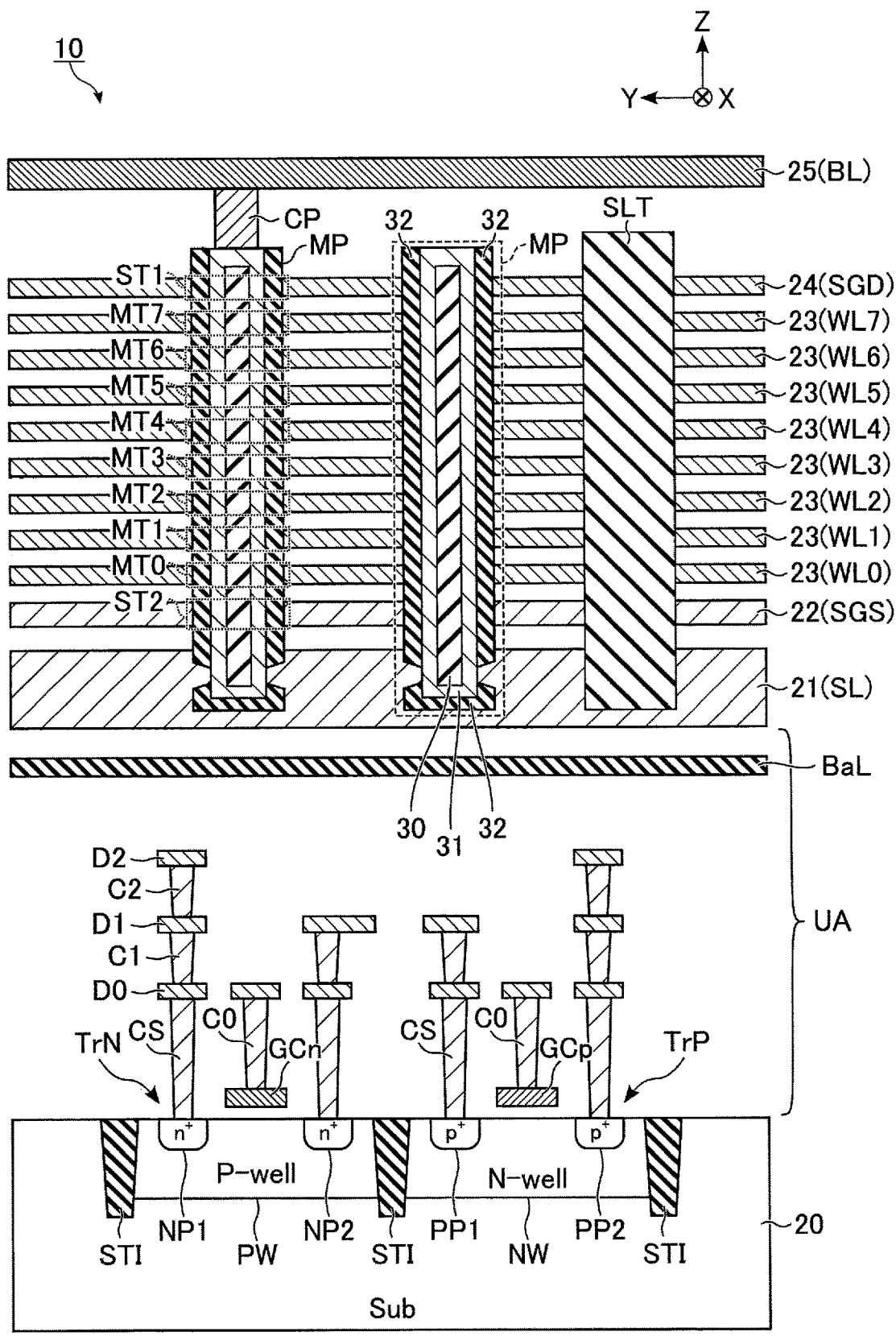
F I G. 4

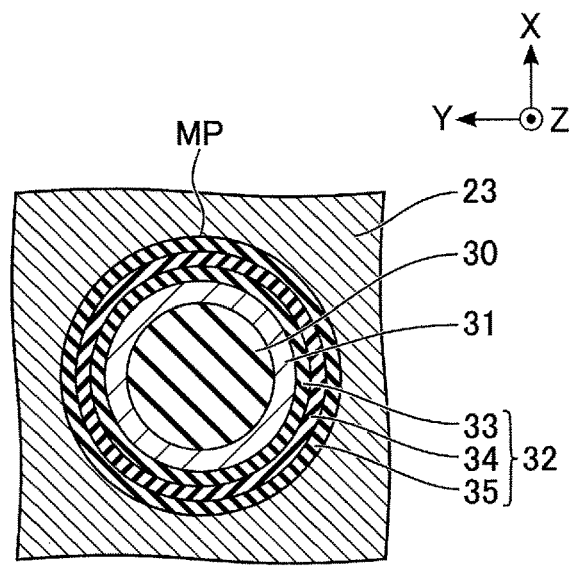
F I G. 5
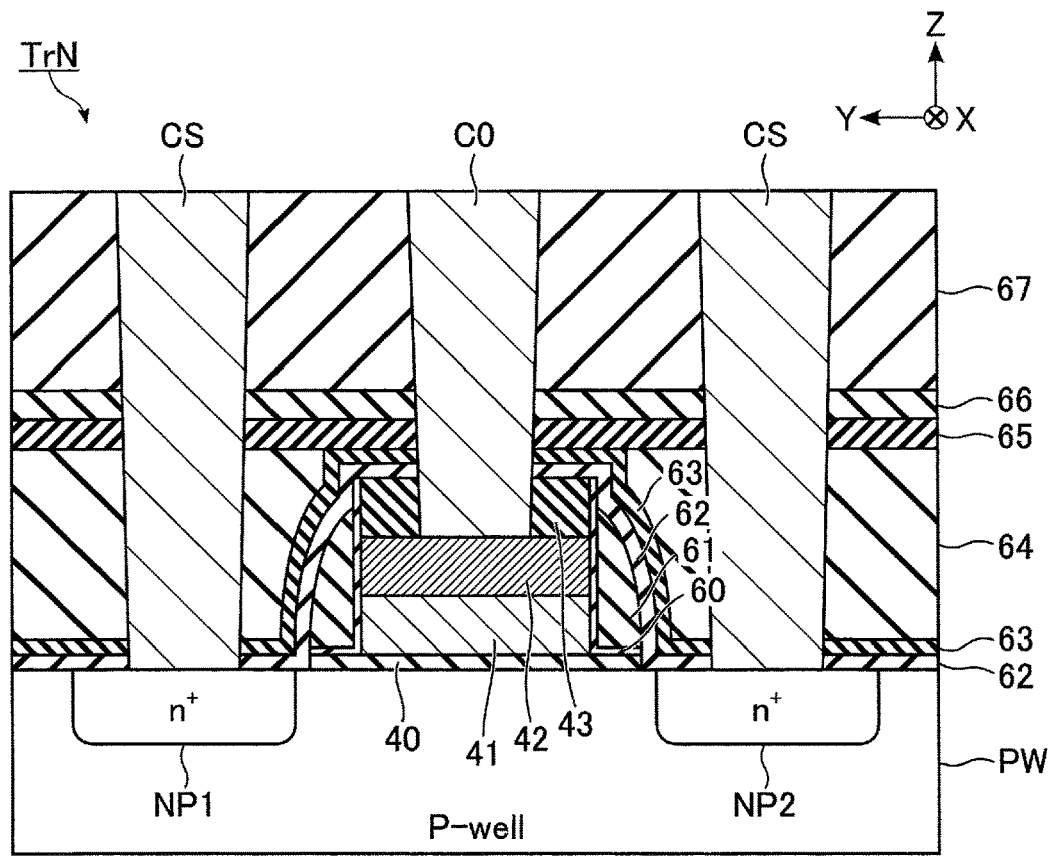
F I G. 6

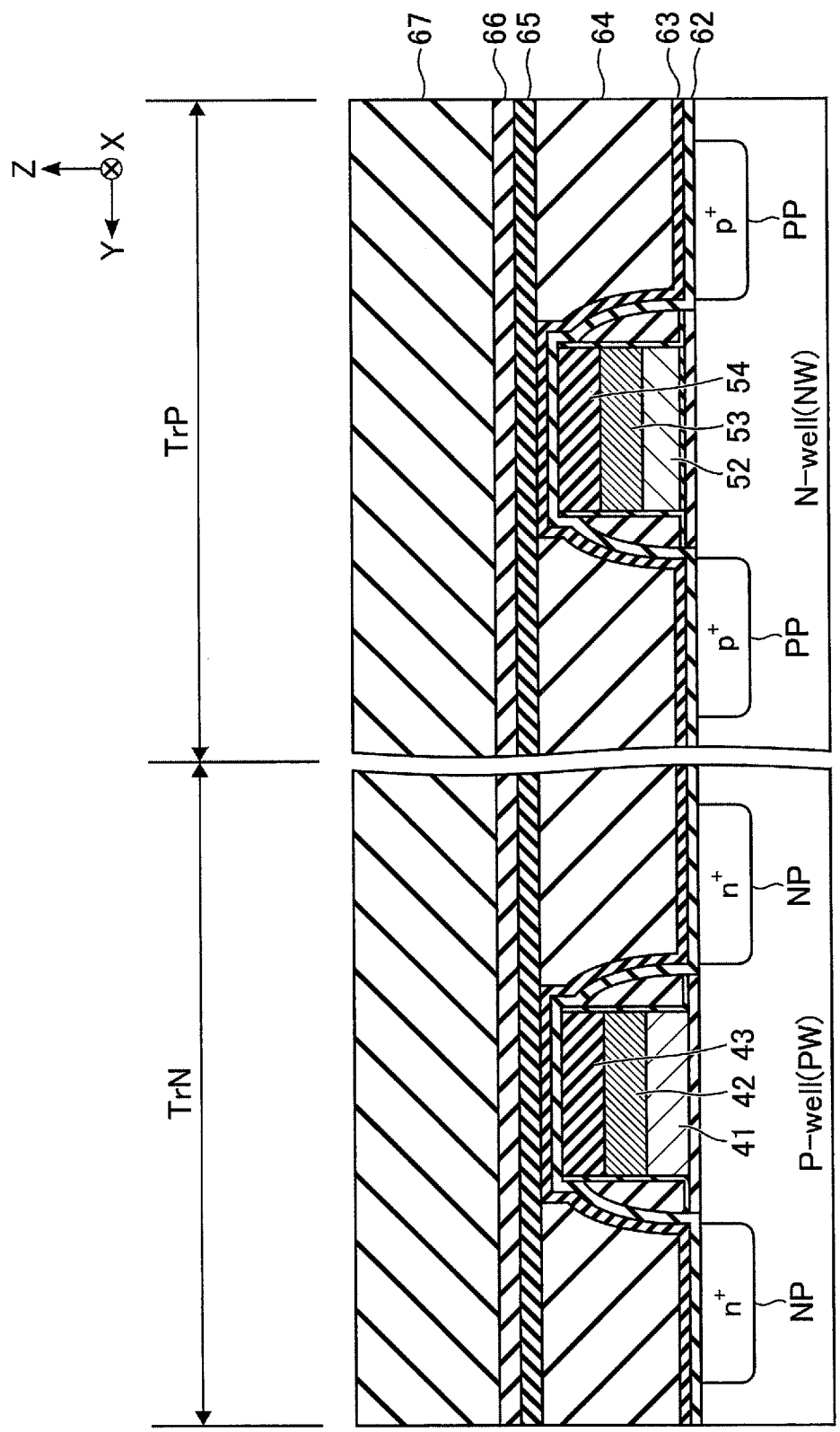
F I G. 9

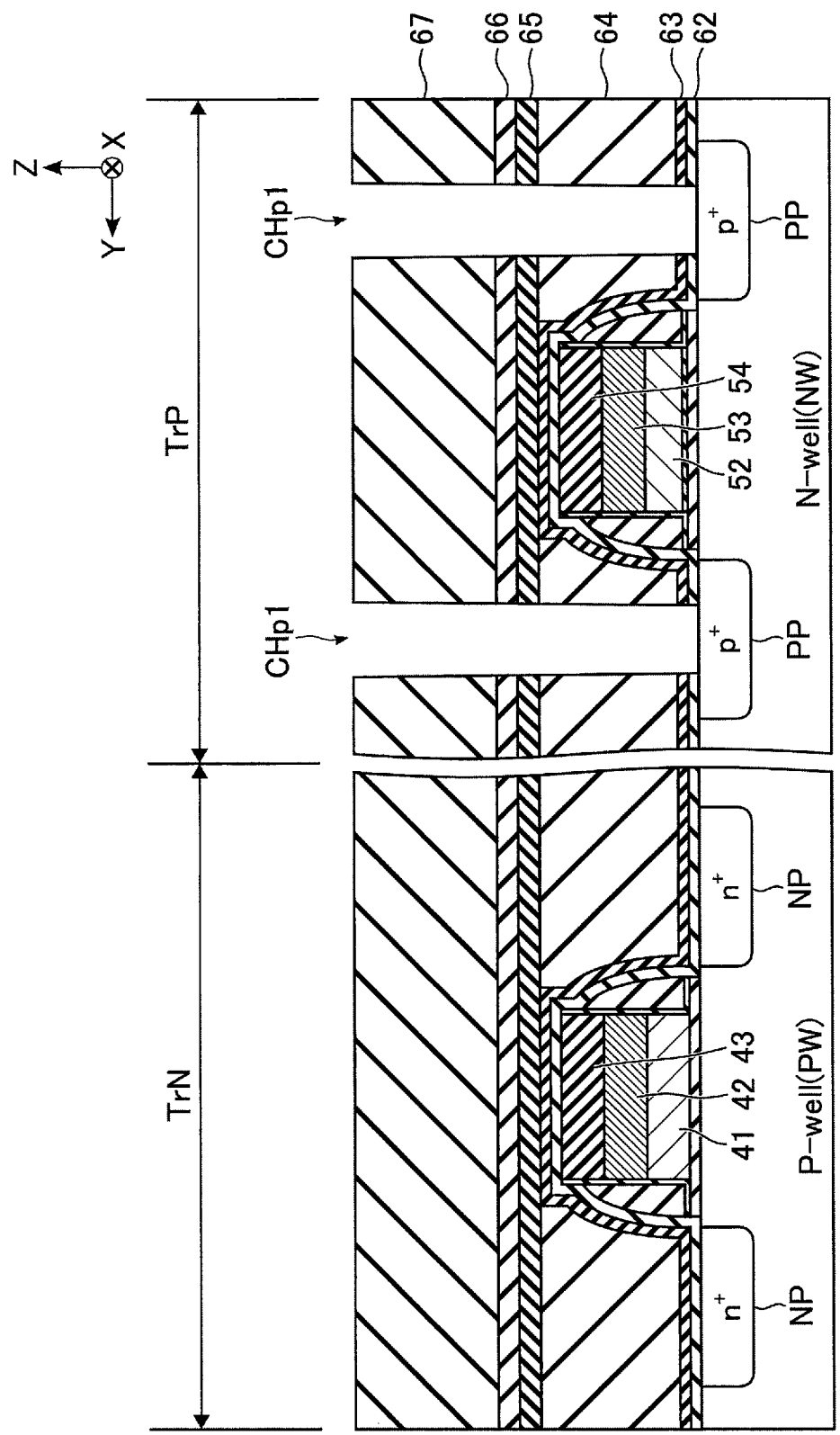
F I G. 10

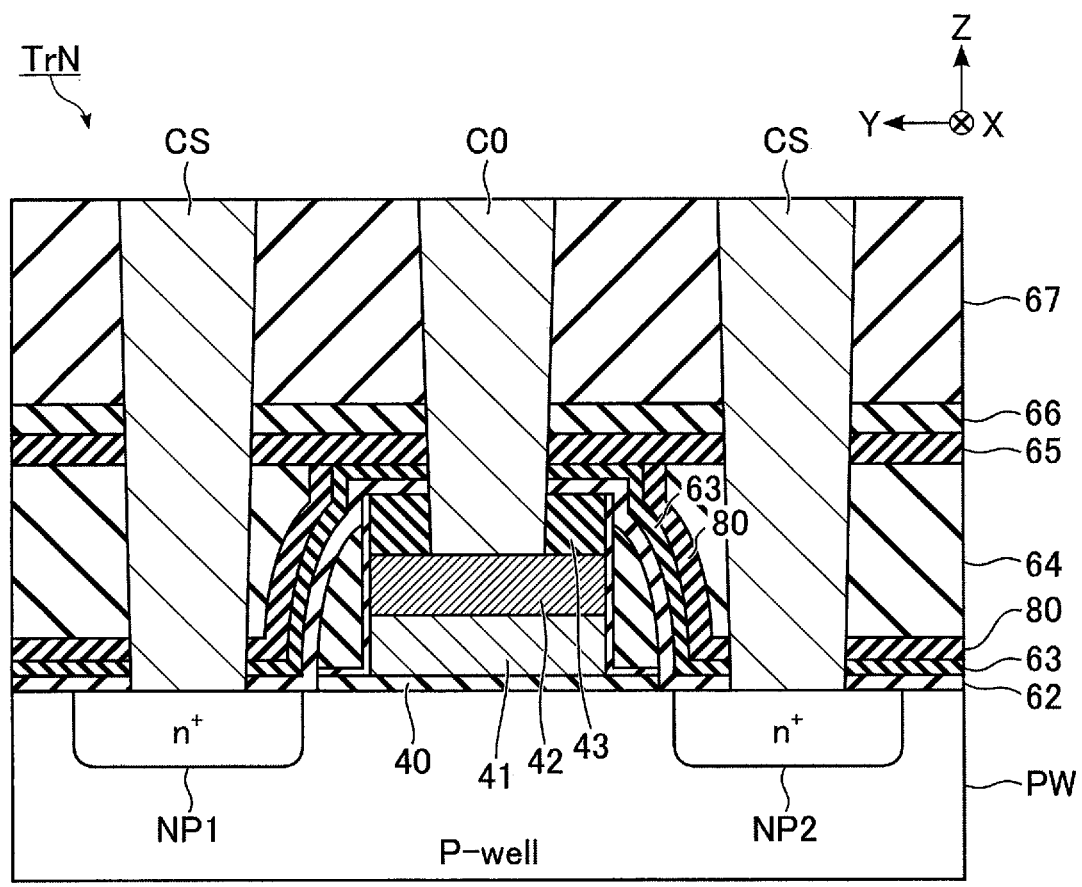
F I G. 16

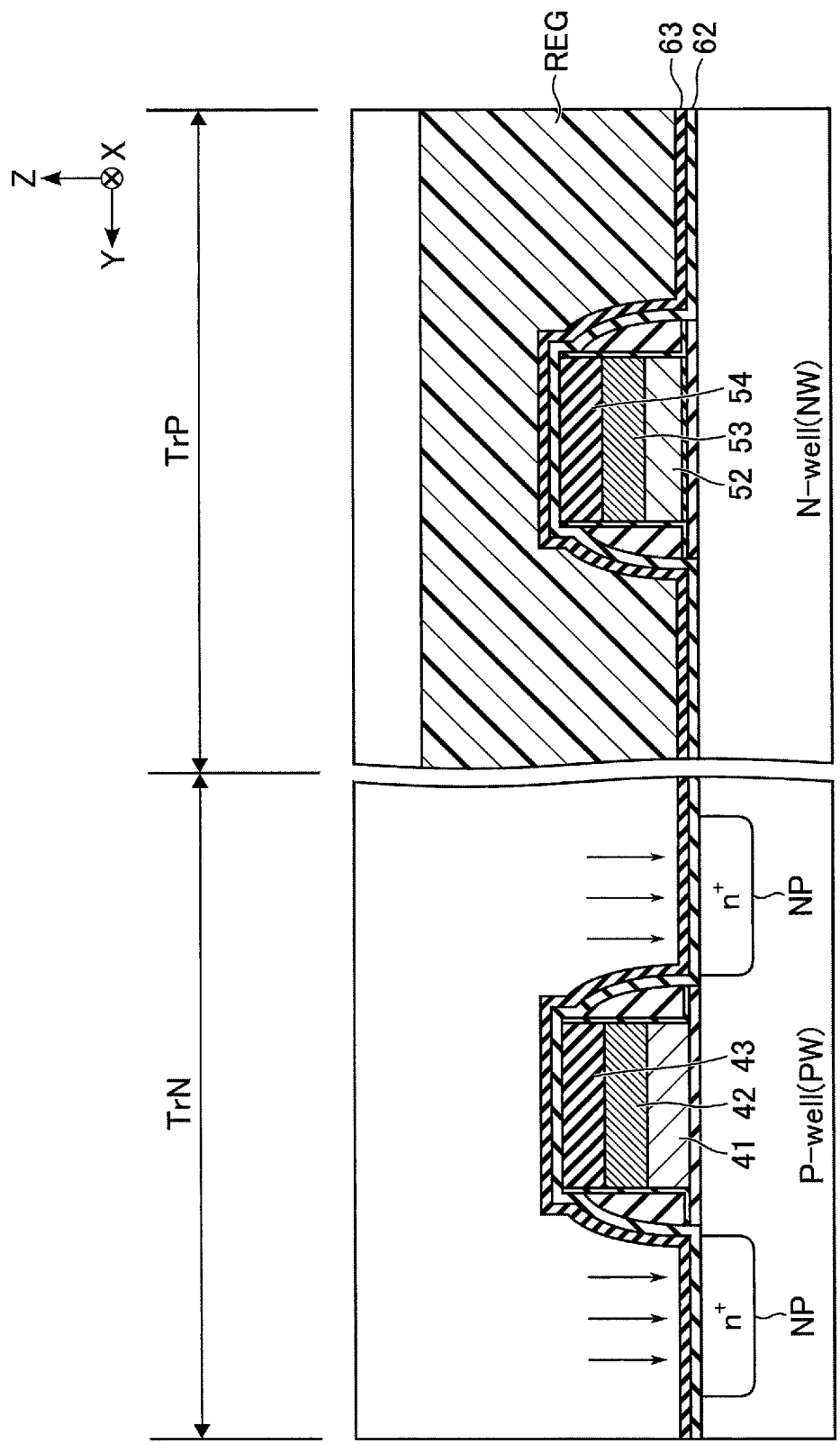
F I G. 18

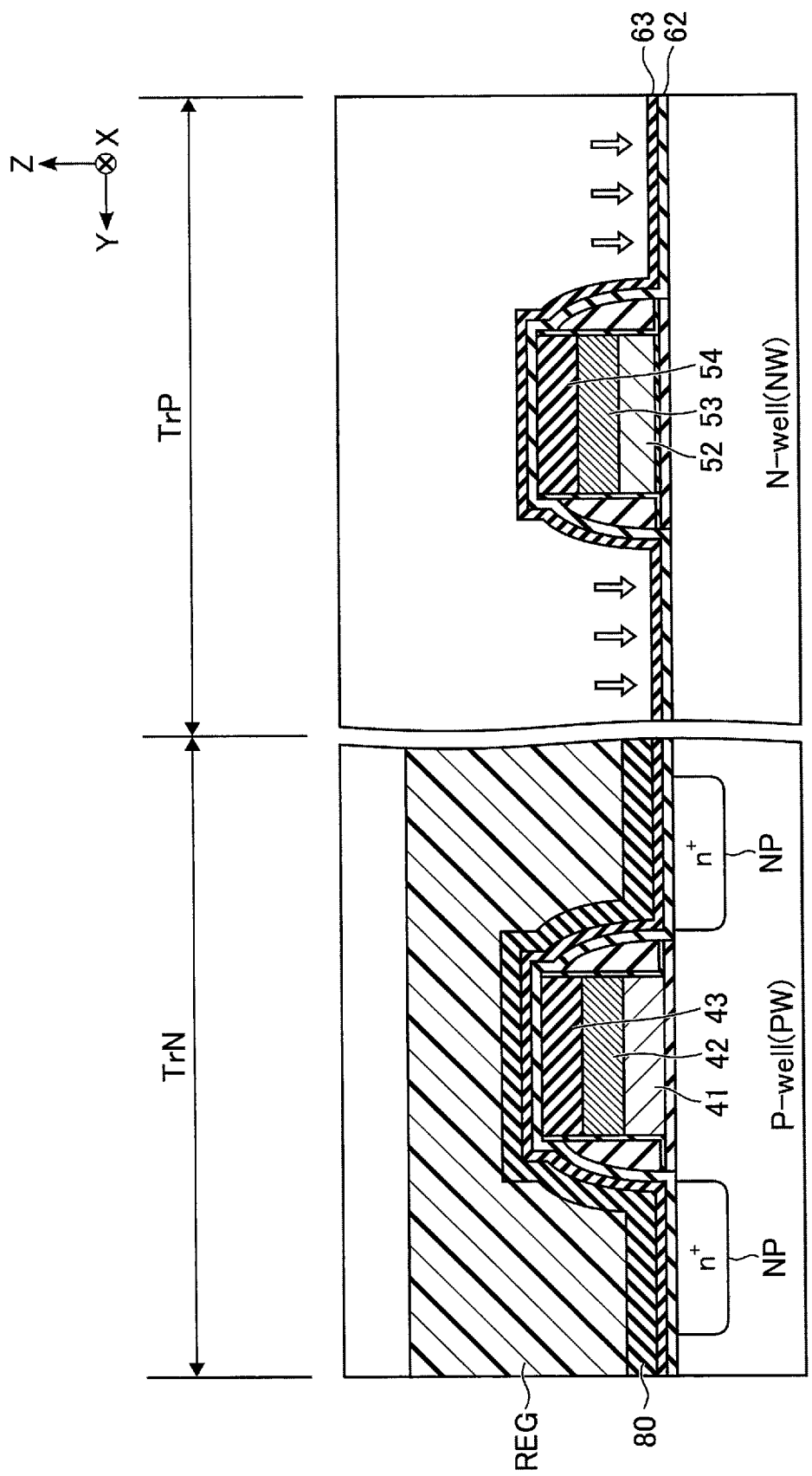
F I G. 20

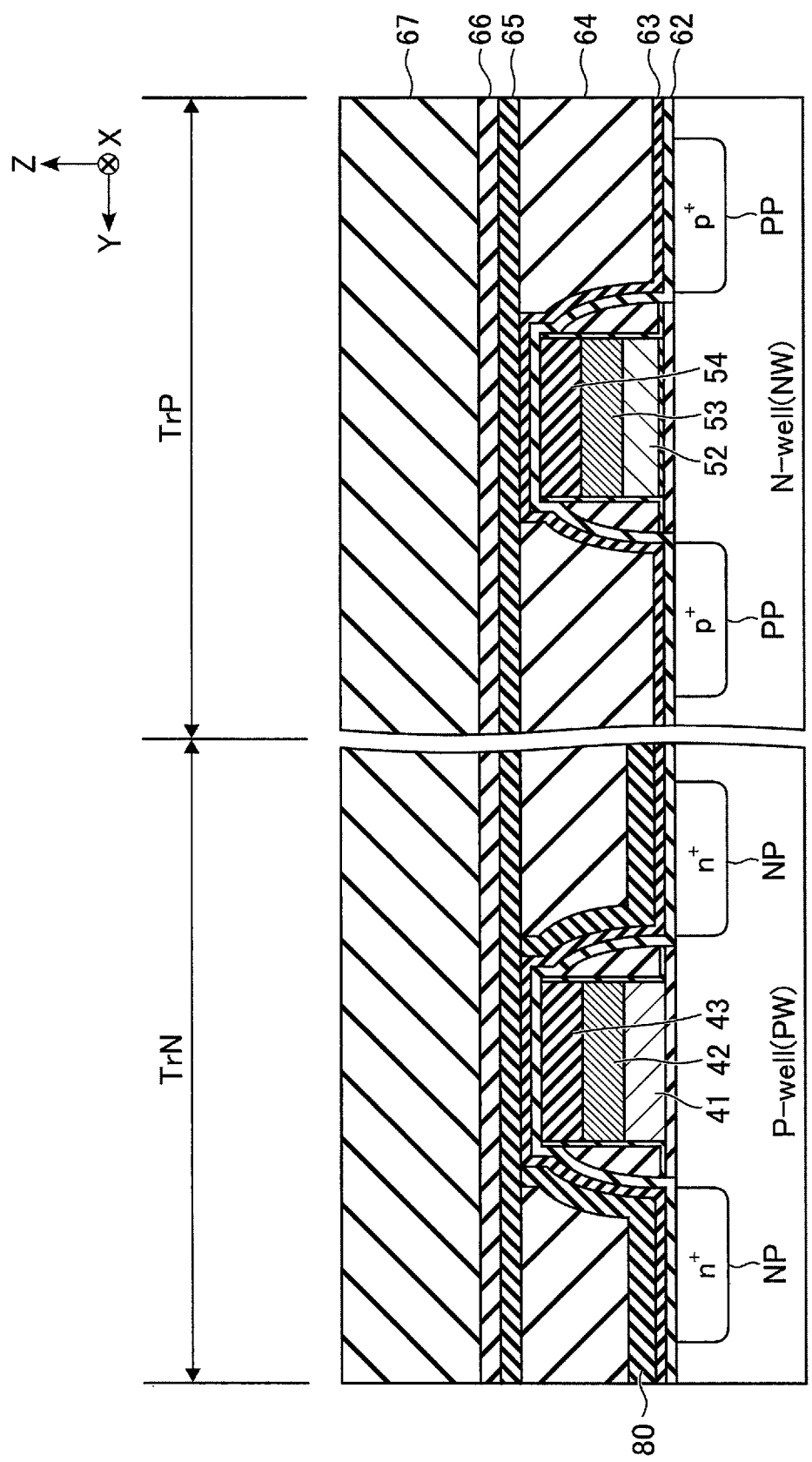
F I G. 22

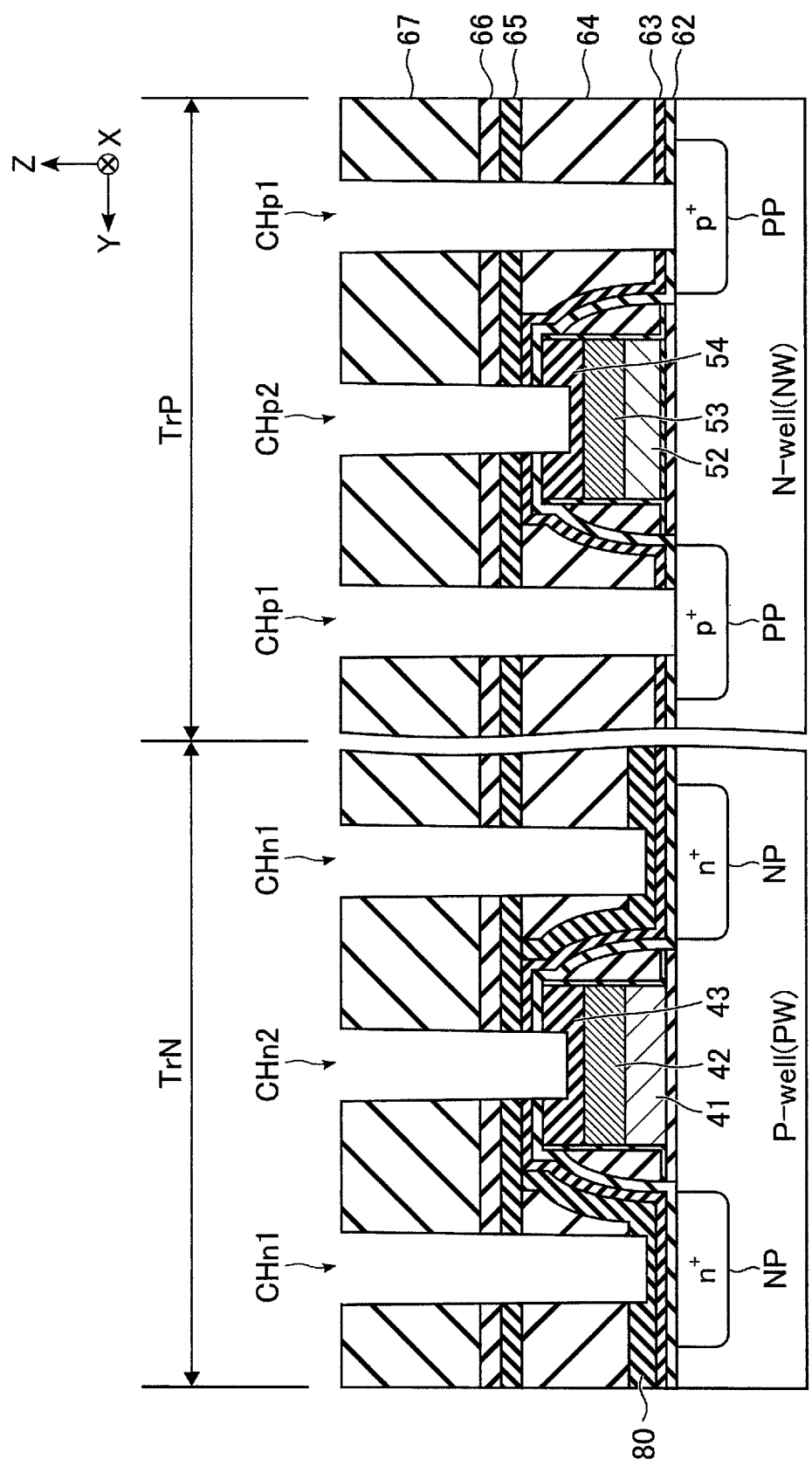
F I G. 23

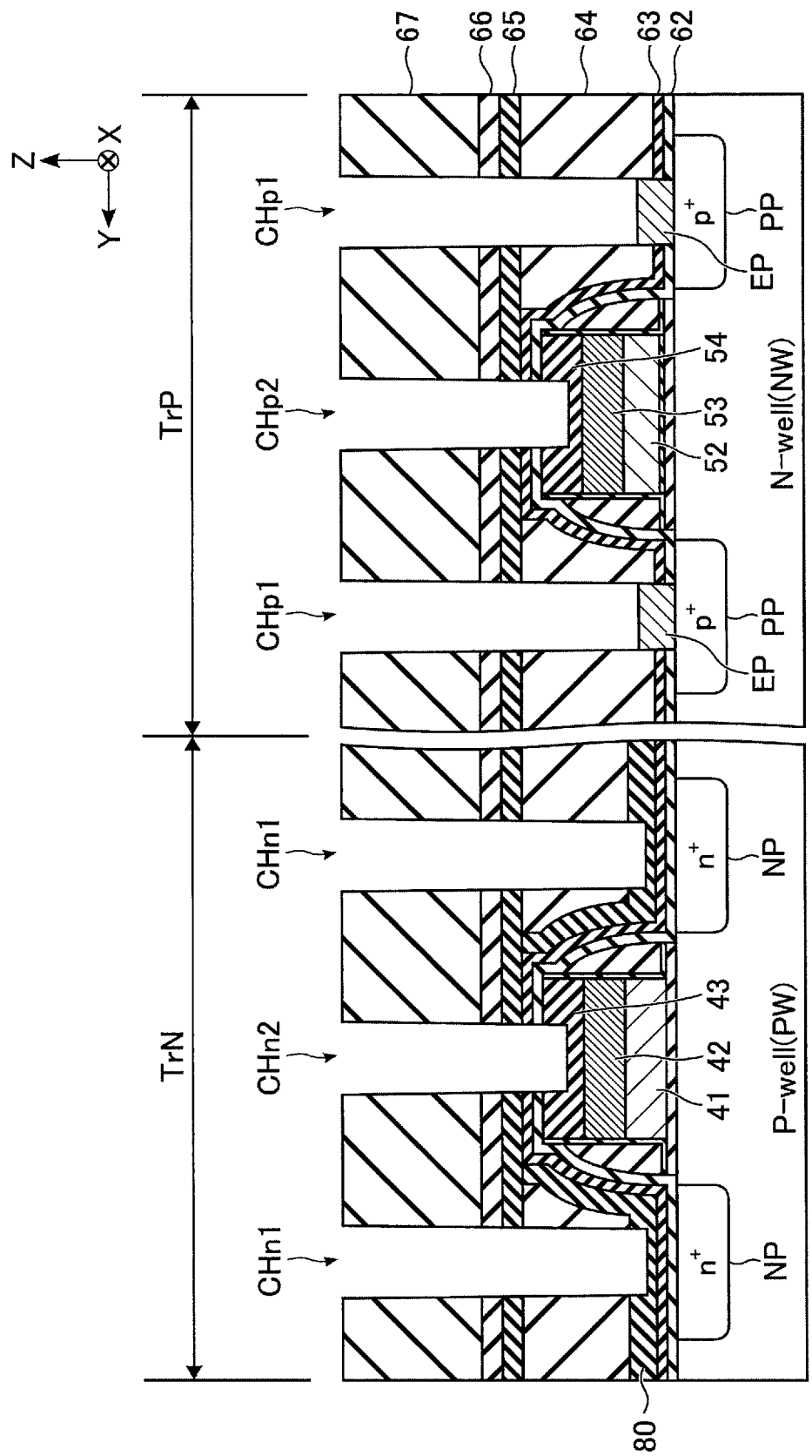
F I G. 24

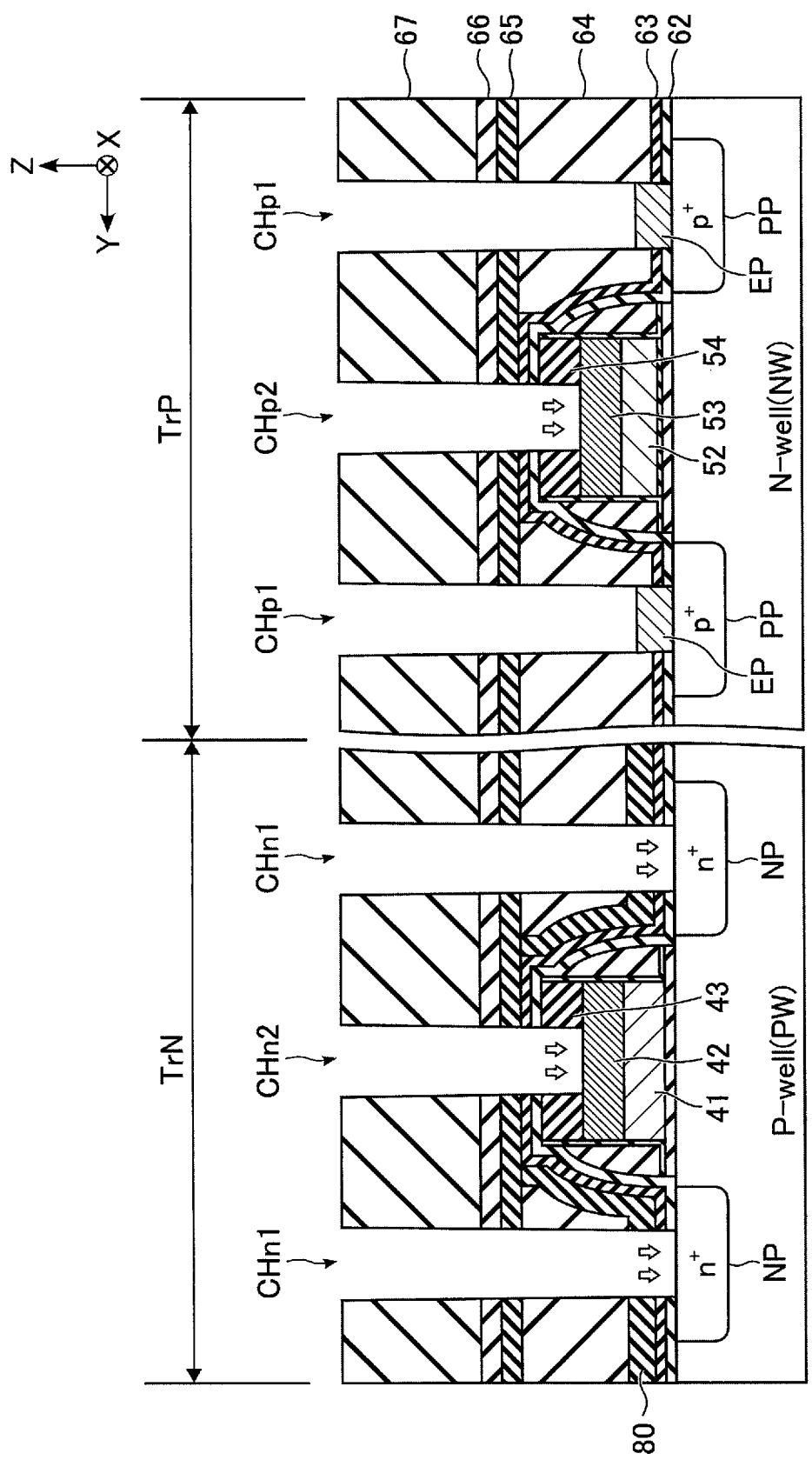
F I G. 25

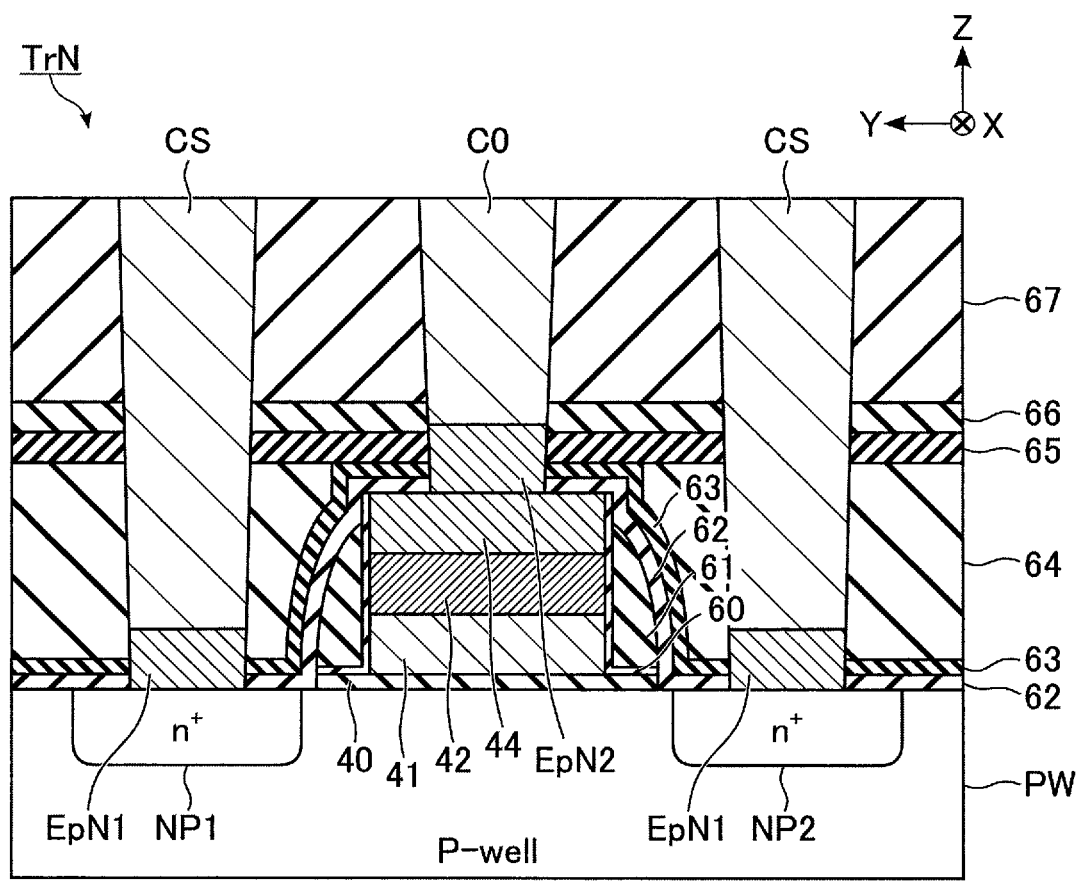
F I G. 27

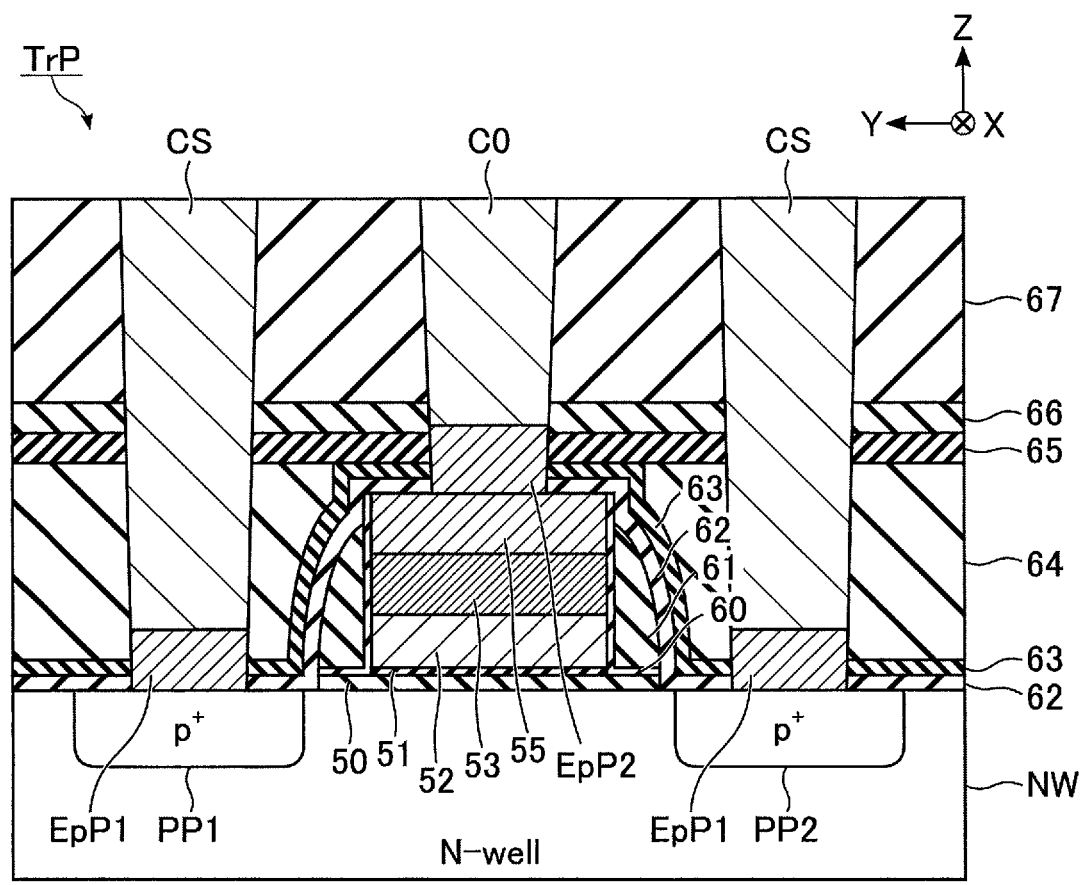
F I G. 28

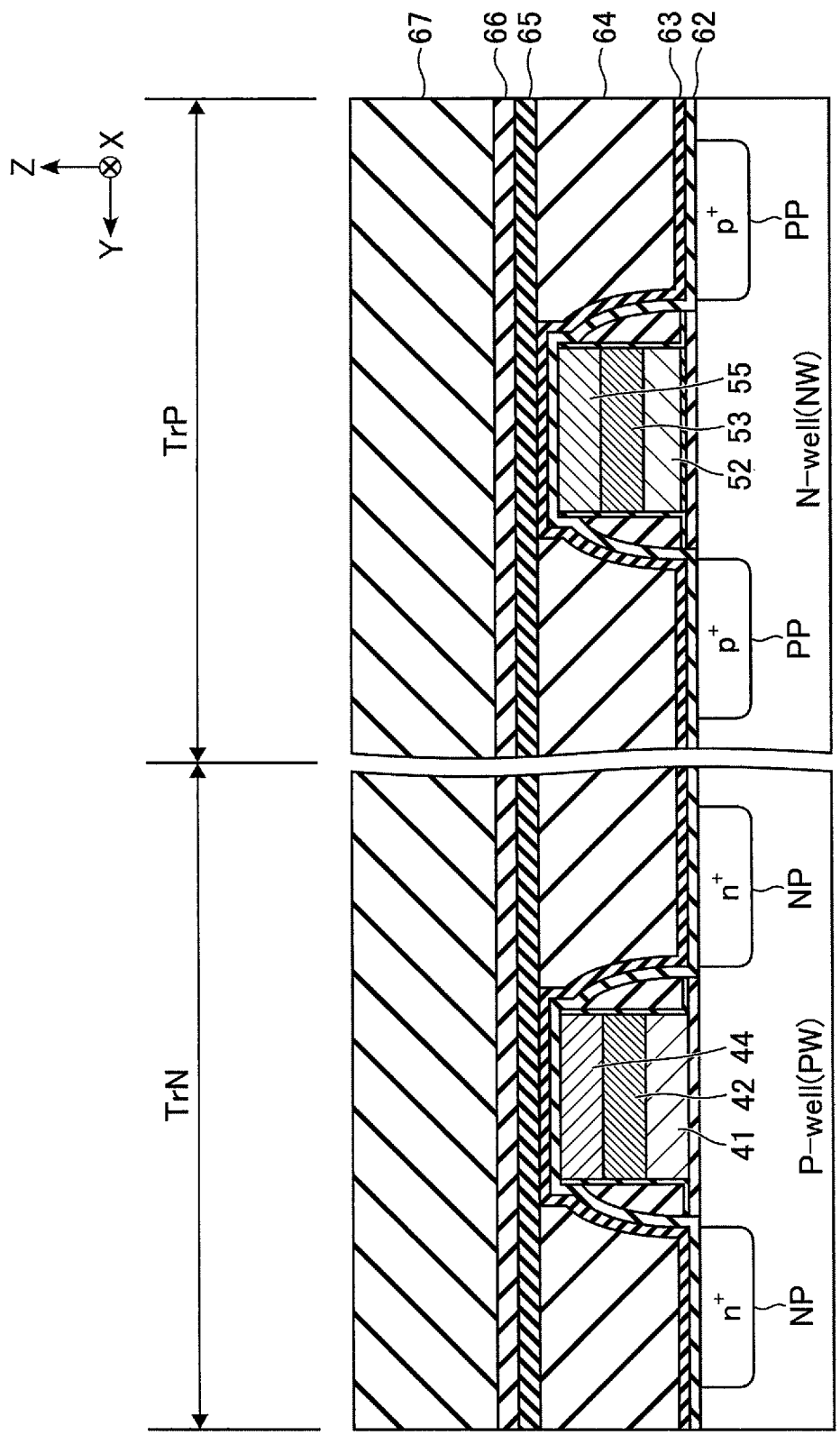
F I G. 29

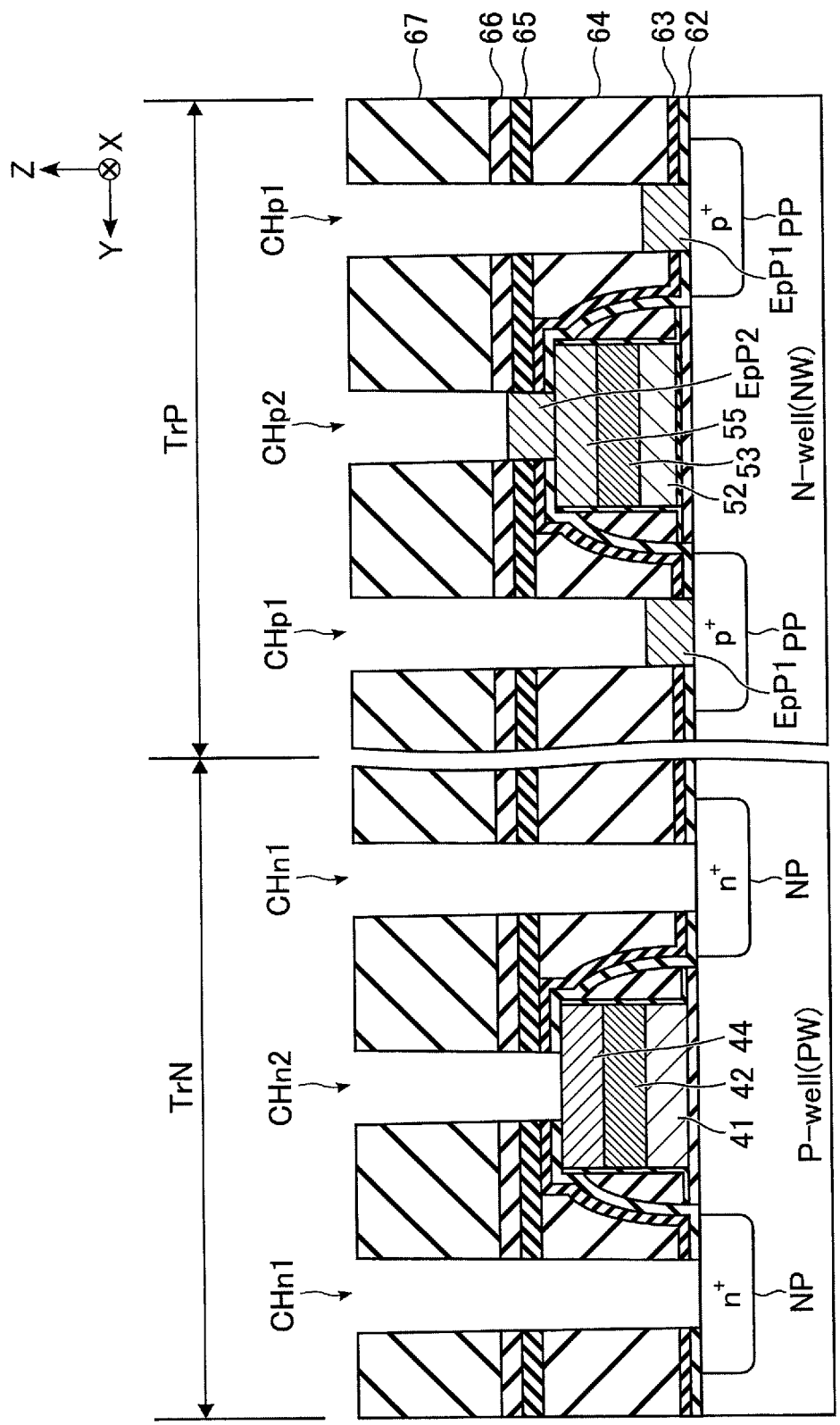
F I G. 32

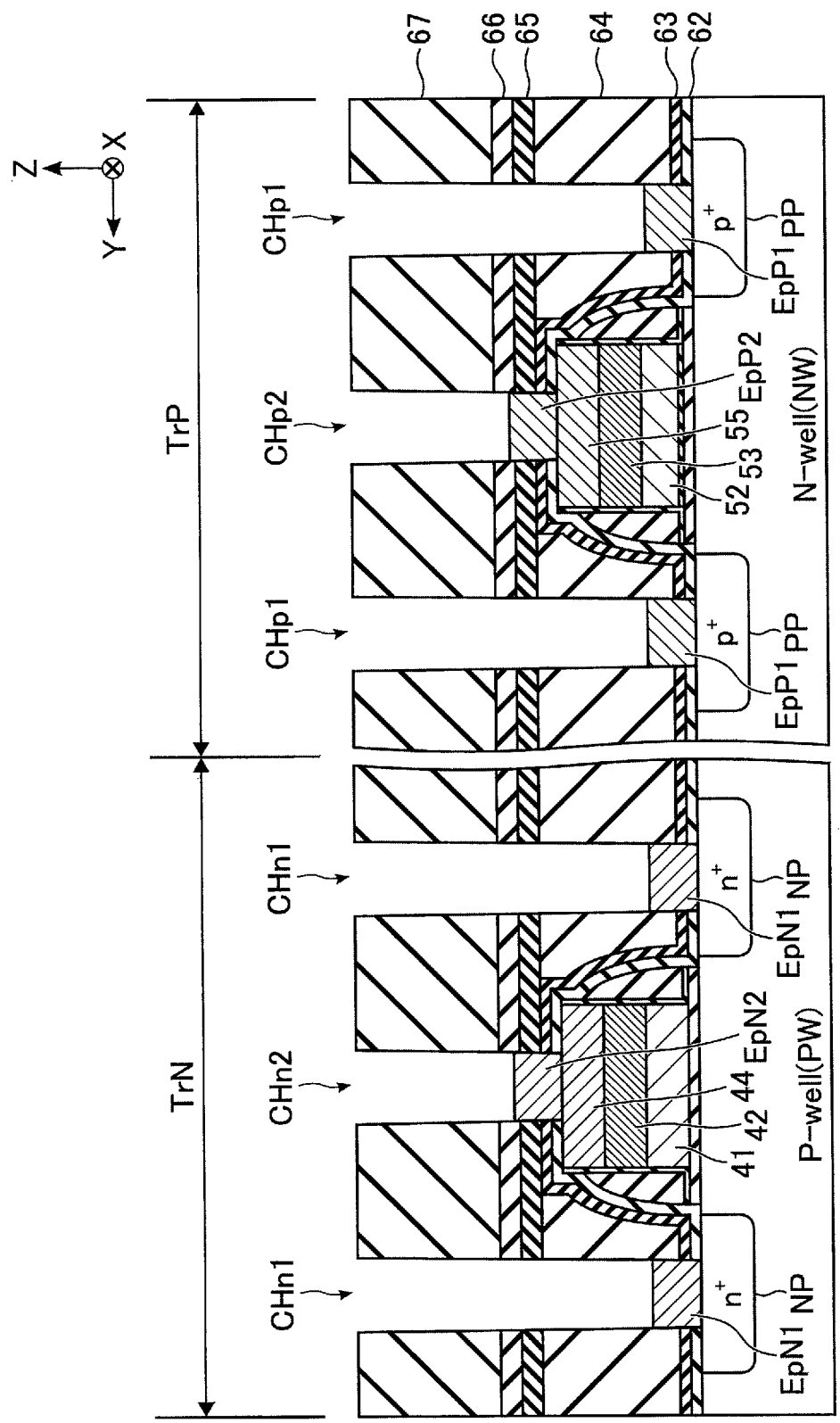
F I G. 33

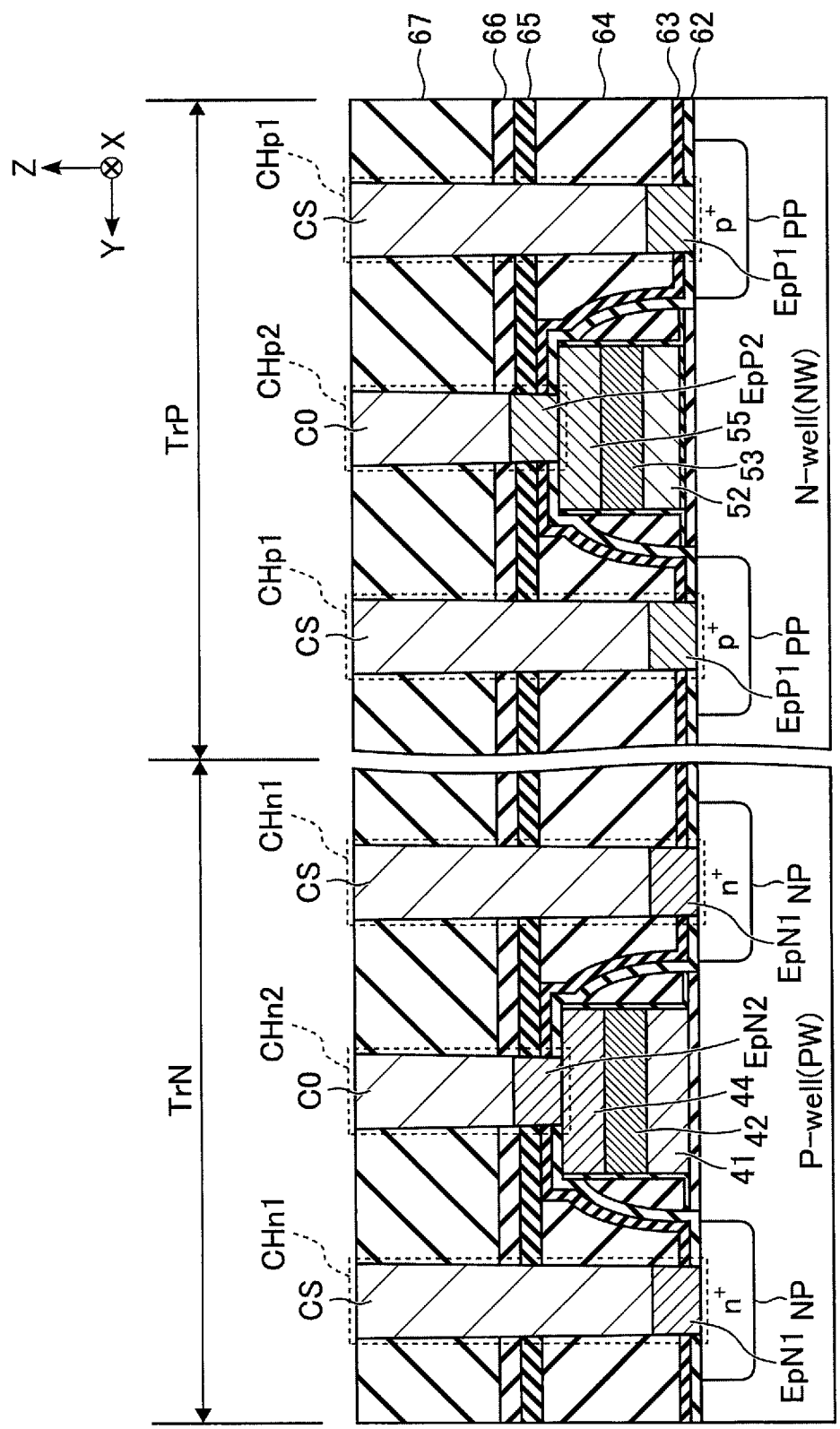
F I G. 34

1

SEMICONDUCTOR DEVICE

CROSS-REFERENCE TO RELATED APPLICATIONS

This application is based upon and claims the benefit of priority from Japanese Patent Application No. 2018-167704, filed Sep. 7, 2018, the entire contents of which are incorporated herein by reference.

FIELD

Embodiments relate to a semiconductor device.

BACKGROUND

There is known a NAND flash memory which can store data nonvolatilely.

BRIEF DESCRIPTION OF THE DRAWINGS

FIG. 2 is a circuit diagram illustrating an example of a circuit configuration of a memory cell array included in the semiconductor device according to the first embodiment.

FIG. 3 is a plan view illustrating an example of a planar layout of the memory cell array included in the semiconductor device according to the first embodiment.

FIG. 4 is a cross-sectional view illustrating an example of a cross-sectional structure of the memory cell array included in the semiconductor device according to the first embodiment.

FIG. 5 is a cross-sectional view illustrating an example of a cross-sectional structure of a memory pillar in the semiconductor device according to the first embodiment.

FIG. 6 is a cross-sectional view illustrating an example of a cross-sectional structure of an NMOS transistor under the memory cell array in the semiconductor device according to the first embodiment.

FIGS. 9, 10, 11, 12, and 13 are cross-sectional views including a structure corresponding to an NMOS transistor and a PMOS transistor, and illustrating an example of a manufacturing step of the semiconductor device according to the first embodiment.

FIG. 16 is a cross-sectional view illustrating an example of a cross-sectional structure of an NMOS transistor under a memory cell array in a semiconductor device according to a second embodiment.

FIGS. 17, 18, 19, 20, 21, 22, 23, 24, 25, and 26 are cross-sectional views including a structure corresponding to an NMOS transistor and a PMOS transistor, and illustrating an example of a manufacturing step of the semiconductor device according to the second embodiment.

FIG. 27 is a cross-sectional view illustrating an example of a cross-sectional structure of an NMOS transistor under a memory cell array in a semiconductor device according to a third embodiment.

FIG. 28 is a cross-sectional view illustrating an example of a cross-sectional structure of a PMOS transistor under the memory cell array in the semiconductor device according to the third embodiment.

FIGS. 29, 30, 31, 32, 33, and 34 are cross-sectional views including a structure corresponding to an NMOS transistor and a PMOS transistor, and illustrating an example of a manufacturing step of the semiconductor device according to the third embodiment.

DETAILED DESCRIPTION

Figure 1:
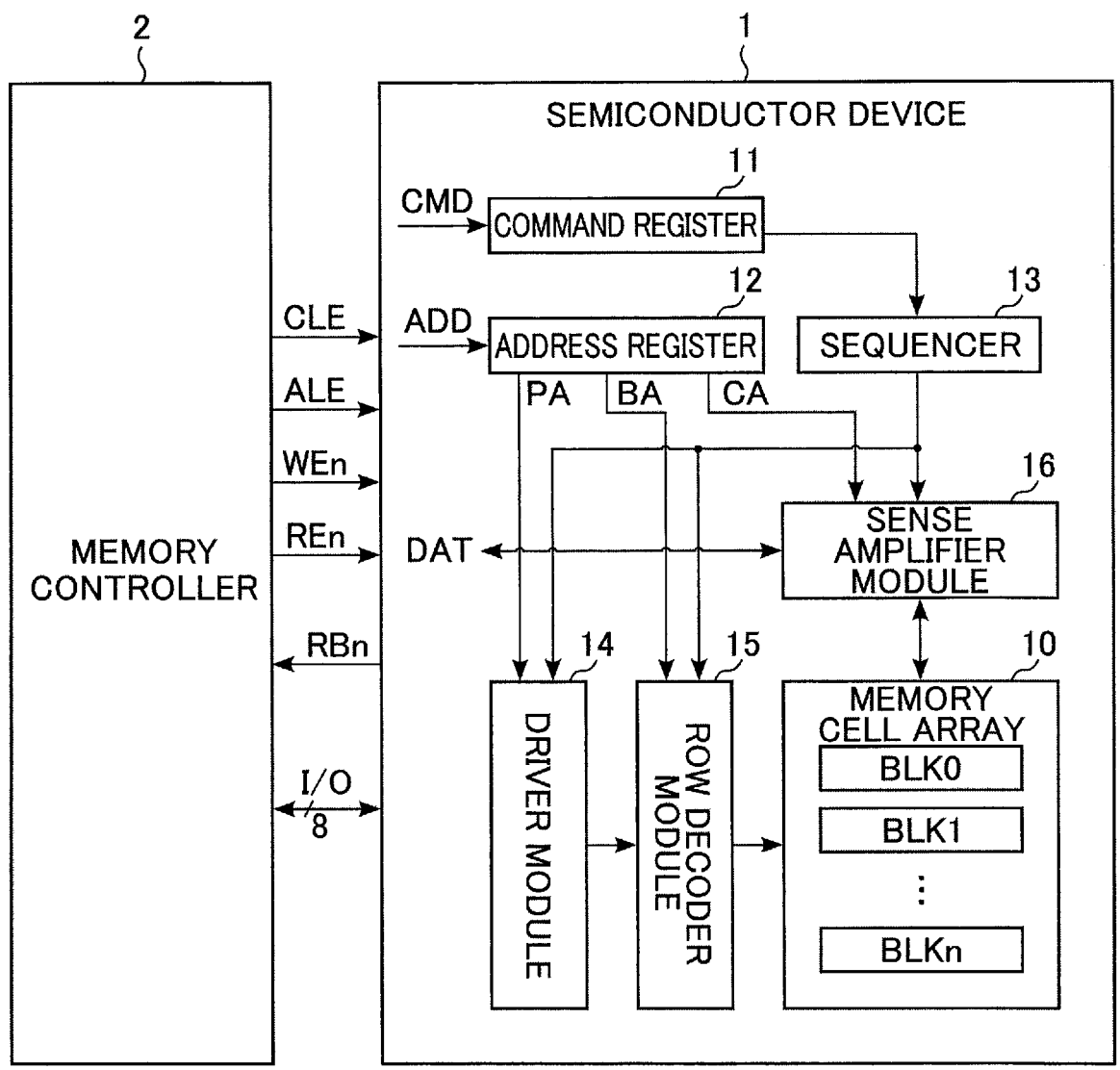
FIG. 1 is a block diagram illustrating a configuration example of a semiconductor device according to a first embodiment.

A semiconductor device according to an embodiment includes an N-well region, a first gate electrode, a columnar epitaxial layer, and a first contact. The N-well region includes two P-type impurity diffusion regions. The first gate electrode is provided above the N-well region between the two P-type impurity diffusion regions. The first gate electrode is opposed to the N-well region via a gate insulating film. The columnar epitaxial layer is provided on at least one of the two P-type impurity diffusion regions. The epitaxial layer includes a first semiconductor layer including P-type impurities. The first contact is provided on the first semiconductor layer of the epitaxial layer.

Hereinafter, embodiments will be described with reference to the accompanying drawings. The embodiments illustrate devices and methods for embodying the technical concept of the invention. The drawings are schematic or conceptual ones. The dimensions, ratios, etc. in the drawings do not necessarily agree with the actual ones. The technical concept of the present invention is not specified by shapes, structures, dispositions, etc. of structural elements.

In the following description, structural elements having substantially the same function and configuration are denoted by the same reference signs. Numeric characters after the letters constituting a reference sign are referred to by reference signs containing the same letters, and are used to distinguish elements having the same structure. When the elements denoted by the reference signs containing the same letters do not need to be distinguished from each other, these elements are referred to by the reference signs containing only the letters.

[1] First Embodiment

FIG. 1 illustrates a configuration example of a semiconductor device 1 according to a first embodiment. The semiconductor device 1 according to the first embodiment will be described hereinafter.

[1-1] Configuration of Semiconductor Device 1

[1-1-1] Entire Configuration of Semiconductor Device 1

The semiconductor device 1 is, for example, a NAND flash memory which can store data nonvolatilely. The semiconductor device 1 is controlled by, for example, an external memory controller 2.

As illustrated in FIG. 1, the semiconductor device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). The block BLK is a set of a plurality of memory cells which can store data nonvolatilely, and the block BLK is used, for example, as an erase unit of data.

In addition, in the memory cell array 10, a plurality of bit lines and a plurality of word lines are provided. Each memory cell is associated with, for example, one bit line and one word line. The detailed configuration of the memory cell array 10 will be described later.

The command register 11 holds a command CMD which the semiconductor device 1 received from the memory controller 2. The command CMD includes, for example, commands for causing the sequencer 13 to execute a read operation, a write operation, and an erase operation.

The address register 12 holds address information ADD which the semiconductor device 1 received from the memory controller 2. The address information ADD includes, for example, a block address BA, a page address PA, and a column address CA. For example, the block address BA, page address PA and column address CA are used for selecting a block BLK, a word line and a bit line, respectively.

The sequencer 13 controls the operation of the entirety of the semiconductor device 1. For example, based on the command CMD that is held in the command register 11, the sequencer 13 controls the driver module 14, row decoder module 15 and sense amplifier module 16, and executes a read operation, a write operation and an erase operation.

The driver module 14 generates voltages which are used in the read operation, write operation and erase operation. In addition, the driver module 14 applies the generated voltage to a signal line corresponding to a selected word line, for example, based on the page address PA that is held in the address register 12.

Based on the block address BA that is held in the address register 12, the row decoder module 15 selects one corresponding block BLK in the memory cell array 10. Then, the row decoder module 15 transfers, for example, the voltage, which was applied to the signal line corresponding to the selected word line, to the selected word line in the selected block BLK.

The sense amplifier module 16 applies, in a write operation, a desired voltage to each bit line, in accordance with write data DAT which is received from the memory controller 2. In addition, in a read operation, the sense amplifier module 16 determines data which is stored in a memory cell, based on the voltage of the bit line, and transfers the determination result to the memory controller 2 as read data DAT.

The communication between the semiconductor device 1 and memory controller 2 supports, for example, a NAND interface standard. For example, in the communication between the semiconductor device 1 and memory controller 2, use is made of a command latch enable signal CLE, an address latch enable signal ALE, a write enable signal WEn, a read enable signal REn, a ready/busy signal RBn, and an input/output signal I/O.

The command latch enable signal CLE is a signal indicating that an input/output signal I/O, which the semiconductor device 1 received, is a command CMD. The address latch enable signal ALE is a signal indicating that a signal I/O, which the semiconductor device 1 received, is address information ADD. The write enable signal WEn is a signal which instructs the semiconductor device 1 to input the input/output signal I/O. The read enable signal REn is a signal which instructs the semiconductor device 1 to output the input/output signal I/O.

The ready/busy signal RBn is a signal which notifies the memory controller 2 whether the semiconductor device 1 is in a ready state in which the semiconductor device 1 accepts an instruction from the memory controller 2, or in a busy state in which the semiconductor device 1 does not accept an instruction from the memory controller 2. The input/output signal I/O is, for example, a signal of an 8-bit width, and may include the command CMD, address information ADD, data DAT, etc.

The above-described semiconductor device 1 and memory controller 2 may constitute a single semiconductor device by being combined. Examples of such a semiconductor device include a memory card such as an SD™ card, and a solid state drive (SSD).

[1-1-2] Circuit Configuration of Memory Cell Array 10

FIG. 2 illustrates an example of a circuit configuration of the memory cell array 10 included in the semiconductor device 1 according to the first embodiment, in which the single block BLK is extracted and shown.

As illustrated in FIG. 2, the block BLK includes, for example, four string units SU0 to SU3. Each string unit SU includes a plurality of NAND strings NS.

The NAND strings NS are associated with bit lines BL0 to BLm (m is an integer of 1 or more), respectively. Each NAND string NS includes, for example, memory cell transistors MT0 to MT7, and select transistors ST1 and ST2.

The memory cell transistor MT includes a control gate and a charge accumulation layer, and stores data nonvolatilely. Each of the select transistors ST1 and ST2 is used for selecting the string unit SU in various operations.

In each NAND string NS, the drain of the select transistor ST1 is connected to the associated bit line BL. The source of the select transistor ST1 is connected to one end of the series-connected memory transistors MT0 to MT7. The other end of the series-connected memory transistors MT0 to MT7 is connected to the drain of the select transistor ST2.

In the same block BLK, the source of the select transistor ST2 is commonly connected to a source line SL. The gates of the select transistors ST1 in the string units SU0 to SU3 are commonly connected to select gate lines SGD0 to SGD3, respectively. The control gates of the memory cell transistors MT0 to MT7 are commonly connected to word lines WL0 to WL7. The gates of the select transistors ST2 are commonly connected to a select gate line SGS.

In the above-described circuit configuration of the memory cell array 10, a plurality of NAND strings NS, to which the same column address CA is allocated, are commonly connected to the same bit line BL between a plurality of blocks BLK. The source line SL is commonly connected between blocks BLK.

A group of memory cell transistors MT connected to the common word line WL in the single string unit SU is referred to as a cell unit CU, for example. For example, the storage capacity of the cell unit CU including memory cell transistors MT each storing 1-bit data is defined as "one-page data". The cell unit CU may have a storage capacity of two or more page data according to the number of bits of data stored in the memory cell transistor MT.

The circuit configuration of the memory cell array 10 included in the semiconductor device 1 according to the embodiment, is not limited to the above-described configuration. For example, the number of memory cell transistors MT and the number of select transistors ST1 and ST2 in each NAND string NS may be designed in any number. The number of string units SU included in each of the blocks BLK may be designed in any number.

[1-1-3] Structure of Memory Cell Array 10

Next, an example of the structure of the memory cell array 10 in the first embodiment will be described.

In the drawings to be referred to below, an X direction corresponds to an extending direction of the word lines WL. A Y direction corresponds to an extending direction of the bit lines BL. A Z direction corresponds to a vertical direction corresponding to a surface of a semiconductor substrate 20 on which the semiconductor device 1 is formed.

In addition, in cross-sectional views to be referred to below, constituent elements such as insulating layers (interlayer insulating films), interconnects and contacts, are appropriately omitted in order to make the figure easy to see. In the plan view, hatching is given as appropriate to make the figure easy to see. The hatching given to the plan view is not necessarily related to the material or characteristics of the hatched component.

FIG. 3 is an example of a planar layout of the memory cell array 10 included in the semiconductor device 1 according to the embodiment, and extracts and illustrates the respective structures corresponding to the string units SU0 and SU1.

As illustrated in FIG. 3, a region in which the memory cell array 10 is formed includes, for example, a plurality of slits SLT, a plurality of string units SU, and a plurality of bit lines BL.

Each of the slits SLT extends in the X direction and are arranged in the Y direction. For example, the single string unit SU is disposed between the slits SLT adjacent to each other in the Y direction.

Each of the string units SU includes a plurality of memory pillars MP. The memory pillars MP are arranged, for example, in a zigzag manner in the X direction. Each of the memory pillars MP functions as, for example, the single NAND string NS.

The bit lines BL each extend in the Y direction and are arranged in the X direction. For example, each of the bit lines BL is disposed so as to overlap with at least one memory pillar MP for each of the string units SU. Specifically, two bit lines BL, for instance, overlap each memory pillar MP.

A contact CP is provided between one of bit lines BL, which overlap a memory pillar MP, and this memory pillar MP. Each of the memory pillars MP is electrically connected to the associated bit line BL via the contact CP.

The number of string units SU provided between the adjacent slits SLT may be designed in any number. The number and arrangement of memory pillars MP illustrated in FIG. 3 are merely examples, and the memory pillars MP may be designed in any number and arrangement. The number of bit lines BL overlapping with each of the memory pillars MP may be designed in any number.

FIG. 4 is a cross-sectional view taken along the line IV-IV of FIG. 3 and illustrates an example of a cross-sectional structure of the memory cell array 10 included in the semiconductor device 1 according to the embodiment.

As illustrated in FIG. 4, a region where the memory cell array 10 is formed includes, for example, conductors 21 to 25, memory pillars MP, contacts CP, and slits SLT.

Concretely, an insulating layer UA is provided on the semiconductor substrate 20. In the insulating layer UA, for example, a circuit such as the sense amplifier module 16 is provided. This circuit includes, for example, an NMOS transistor TrN and a PMOS transistor TrP. The details of configurations relating to the NMOS transistor TrN and PMOS transistor TrP will be described later.

The conductor 21 is provided on the insulating layer UA. For example, the conductor 21 is formed in a plate shape extending along an XY plane, and used as the source line SL. The conductor 21 includes, for example, silicon (Si).

The conductor 22 is provided above the conductor 21 with an insulating layer interposed therebetween. For example, the conductor 22 is formed in a plate shape extending along the XY plane, and is used as the select gate line SGS. The conductor 22 includes, for example, silicon (Si).

Insulating layers and conductors 23 are alternately stacked above the conductor 22. For example, each conductor 23 is formed in a plate shape extending along the XY plane. The stacked conductors 23 are used as word lines WL0 to WL7 in the order from the semiconductor substrate 20 side. Each conductor 23 includes, for example, tungsten (W).

The conductor 24 is provided above the uppermost conductor 23 with an insulating layer interposed therebetween. The conductor 24 is formed, for example, in a plate shape extending along the XY plane, and is used as the select gate line SGD. The conductor 24 includes, for example, tungsten (W).

The conductor 25 is provided above the conductor 24 with an insulating layer interposed therebetween. For example, the conductor 25 is formed in a line shape extending along the Y direction, and used as the bit line BL. Specifically, in a region not illustrated, a plurality of conductors 25 are arranged in the X direction. The conductor 25 includes, for example, copper (Cu).

The memory pillar MP is formed in a columnar shape extending along the Z direction, and penetrates, for example, the conductors 22 to 24. Concretely, an upper end of the memory pillar MP is included, for example, in a layer between a layer provided with the conductor 24 and a layer provided with the conductor 25. A lower end of the memory pillar MP is included, for example, in a layer provided with the conductor 21.

In addition, the memory pillar MP includes a core member 30, a semiconductor 31 and a multilayer film 32.

The core member 30 is formed in a columnar shape extending along the Z direction. An upper end of the core member 30 is included, for example, in a layer above the layer provided with the conductor 24. A lower end of the core member 30 is included, for example, in the layer provided with the conductor 21. The core member 30 includes, for example, an insulator such as silicon oxide ($SiO_2$).

The core member 30 is covered with the semiconductor 31. The semiconductor 31 is put in contact with the conductor 21, for example, via a side surface of the memory pillar MP. The semiconductor 31 is, for example, polycrystalline silicon (Si). The multilayer film 32 covers the side surface and bottom surface of the semiconductor 31, excluding the part at which the conductor 21 and semiconductor 31 are put in contact.

FIG. 5 illustrates an example of a cross-sectional structure of the memory pillar MP in a cross section which is parallel to the surface of the semiconductor substrate 20 and includes the conductor 23.

As illustrated in FIG. 5, in the layer including the conductor 23, the core member 30 is provided in the central portion of the memory pillar MP. The semiconductor 31 surrounds the side surface of the core member 30. The multilayer film 32 surrounds the side surface of the semiconductor 31. The multilayer film 32 includes, for example, a tunnel oxide film 33, an insulating film 34 and a block insulating film 35.

The tunnel oxide film 33 surrounds the side surface of the semiconductor 31. The insulating film 34 surrounds the side surface of the tunnel oxide film 33. The block insulating film 35 surrounds the side surface of the insulating film 34. The conductor 23 surrounds the side surface of the block insulating film 35.

The tunnel oxide film 33 includes, for example, silicon oxide ($SiO_2$). The insulating film 34 includes, for example, silicon nitride (SiN). The block insulating film 35 includes, for example, silicon oxide ($SiO_2$).

Referring back to FIG. 4, a columnar contact CP is provided on the semiconductor 31. In the region illustrated, a contact CP corresponding to one of the two memory pillars MP is depicted. In a region not illustrated, a contact CP is connected to the memory pillar MP to which the contact CP is not connected in the illustrated region.

One conductor 25, i.e. one bit line BL, is connected to a top surface of the contact CP. The memory pillar MP and conductor 25 may be electrically connected via two or more contacts, or may be electrically connected via some other interconnect.

The slit SLT is formed in a plate shape extending along the Z direction, and divides, for example, the conductors 22 to 24. Concretely, an upper end of the slit SLT is included, for example, in a layer between a layer including the upper end of the memory pillar MP and a layer provided with the conductor 25. A lower end of the slit SLT is included, for example, in a layer provided with the conductor 21.

An insulator is provided in the inside of the slit SLT. The insulator includes, for example, an insulating material such as silicon oxide ($SiO_2$). Note that the inside of the slit SLT may be composed of a plurality of kinds of insulators. For example, before silicon oxide is buried in the slit SLT, silicon nitride (SiN) may be formed as a side wall of the slit SLT.

In the above-described configuration of the memory pillar MP, for example, a portion where the memory pillar MP intersects the conductor 22 functions as the select transistor ST2. A portion where the memory pillar MP intersects the conductor 23 functions as the memory cell transistor MT. A portion where the memory pillar MP intersects the conductor 24 functions as the select transistor ST1.

Specifically, the semiconductor 31 functions as a channel of each of the memory cell transistors MT and select transistors ST1 and ST2. The insulating film 34 is used as a charge accumulation layer of the memory cell transistor MT.

In the above-described structure of the memory cell array 10, the number of conductors 23 is designed based on the number of word lines WL. A plurality of conductors 24, which are provided in a plurality of layers, may be allocated to the select gate line SGD. A plurality of conductors 22, which are provided in a plurality of layers, may be allocated to the select gate line SGS. When the select gate line SGS is provided in plural layers, conductors that are different from the conductor 22 may be used.

[1-1-4] Structures of NMOS Transistor TrN and PMOS Transistor TrP

Hereinafter, examples of structures of the NMOS transistor TrN and PMOS transistor TrP in the first embodiment will be described.

(Outline of the Structure Under Memory Cell Array 10)

To begin with, further referring to FIG. 4, a description is given of the outline of the structure including the NMOS transistor TrN and PMOS transistor TrP which are provided under the memory cell array 10.

The semiconductor substrate 20 includes, for example, a P-well region PW, an N-well region NW, and element isolation regions STI. The insulating layer UA includes, for example, conductors GC, D0, D1 and D2, contacts CS, C0, C1 and C2, and a barrier layer BaL.

Each of the P-well region PW, N-well region NW and element isolation regions STI is in contact with a top surface of the semiconductor substrate 20. The N-well region NW and P-well region PW are insulated by the element isolation region STI.

The P-well region PW includes $n^+$ impurity diffusion regions NP1 and NP2. The $n^+$ impurity diffusion region NP1 is disposed spaced apart from the $n^+$ impurity diffusion region NP2. Each of the $n^+$ impurity diffusion regions NP1 and NP2 is in contact with the top surface of the semiconductor substrate 20. Each of the $n^+$ impurity diffusion regions NP1 and NP2 is doped with, for example, phosphorus (P).

The N-well region NW includes $p^+$ impurity diffusion regions PP1 and PP2. The $p^+$ impurity diffusion region PP1 is disposed spaced apart from the $p^+$ impurity diffusion region PP2. Each of the $p^+$ impurity diffusion regions PP1 and PP2 is in contact with the top surface of the semiconductor substrate 20. Each of the $p^+$ impurity diffusion regions PP1 and PP2 is doped with, for example, boron (B).

A conductor GCn is provided above the P-well region PW between the $n^+$ impurity diffusion regions NP1 and NP2. A conductor GCp is provided above the N-well region NW between the $p^+$ impurity diffusion regions PP1 and PP2. Each conductor D0 is an interconnect provided in a layer above the conductors GCn and GCp. Each conductor D1 is an interconnect provided in a layer above each conductor D0. Each conductor D2 is an interconnect provided in a layer above each conductor D1.

Each contact CS is a columnar conductor provided between the semiconductor substrate 20 and conductor D0. Each contact C0 is a columnar conductor provided between the conductor GCn or GCp and the conductor D0. Each contact C1 is a columnar conductor provided between the conductor D0 and conductor D1. Each contact C2 is a columnar conductor provided between the conductor D1 and conductor D2.

The $n^+$ impurity diffusion regions NP1 and NP2 and $p^+$ impurity diffusion regions PP1 and PP2 are electrically connected to different conductors D0 via the contacts CS. The conductors GCn and GCp are electrically connected to different conductors D0 via the contacts C0. The conductor D0 and conductor D1 are electrically connected via the contact C1 as appropriate. The conductor D1 and conductor D2 are electrically connected via the contact C2 as appropriate.

The barrier layer BaL is an insulating layer provided in a layer above the conductors D2. In other words, the barrier layer BaL is provided between the structure corresponding to the memory cell array 10 and the circuit provided under the memory cell array 10. When the structure corresponding to the memory cell array 10 is formed in the manufacturing process of the semiconductor device 1, the barrier layer BaL prevents impurities (e.g. hydrogen), which occurs from the structure, from entering the circuit under the memory cell array 10. The barrier layer BaL includes, for example, silicon nitride (SiN).

In the above-described structure, a set of the P-well region PW, $n^+$ impurity diffusion regions NP1 and NP2, and conductor GCn functions as the NMOS transistor TrN. A set of the N-well region NW, p+ impurity diffusion regions PP1 and PP2, and conductor GCp functions as the PMOS transistor TrP.

Specifically, the conductor GCn is used as a gate electrode of the NMOS transistor TrN. One of the n+ impurity diffusion regions NP1 and NP2 functions as a drain of the NMOS transistor TrN, and the other of the n+ impurity diffusion regions NP1 and NP2 functions as a source of the NMOS transistor TrN.

Similarly, the conductor GCp is used as a gate electrode of the PMOS transistor TrP. One of the p+ impurity diffusion regions PP1 and PP2 functions as a drain of the PMOS transistor TrP, and the other of the p+ impurity diffusion regions PP1 and PP2 functions as a source of the PMOS transistor TrP.

(Structure of NMOS Transistor TrN)

Next, an example of a more detailed structure of the NMOS transistor TrN will be described.

FIG. 6 illustrates an example of a cross-sectional structure of the NMOS transistor TrN under the memory cell array 10 in the semiconductor device 1 according to the first embodiment.

As illustrated in FIG. 6, a region of the NMOS transistor TrN includes the P-well region PW, n+ impurity diffusion regions NP1 and NP2 and contacts CS and C0, which were described with reference to FIG. 4, and includes an oxide film 40, a semiconductor layer 41, a conductive layer 42, an insulating layer 43, oxide films 60, 61, 62 and 66, nitride films 63 and 65, and insulators 64 and 67.

Concretely, the oxide film 40 is provided on the P-well region PW between the n+ impurity diffusion regions NP1 and NP2. The oxide film 40 includes, for example, silicon oxide (SiO$_2$), and is used as a gate insulating film of the NMOS transistor TrN.

The semiconductor layer 41, conductive layer 42 and insulating layer 43 are successively stacked on the oxide film 40. The semiconductor layer 41 is an N-type semiconductor, and is, for example, polycrystalline silicon which is doped with phosphorus (P).

The conductive layer 42 includes, for example, tungsten silicide (WSi). The insulating layer 43 includes, for example, silicon nitride (SiN). For example, a set of the semiconductor layer 41 and conductive layer 42 is used as a gate electrode (conductor GCn) of the NMOS transistor TrN. The insulating layer 43 is used, for example, as an etching stopper.

The oxide films 60 and 61 are successively provided on a top surface of the oxide film 40 and on side surfaces of the semiconductor layer 41, conductive layer 42 and insulating layer 43. Each of the oxide films 60 and 61 includes, for example, silicon oxide (SiO$_2$), and is used as a side wall of the gate electrode of the NMOS transistor TrN.

The oxide film 62 and nitride film 63, each of which is continuously provided, are successively provided on the top surface and side surface of the structure formed of the oxide film 40, semiconductor layer 41, conductive layer 42, insulating layer 43 and oxide films 60 and 61, and on the top surface of the P-well region PW. Specifically, the oxide film 62 and nitride film 63 cover the structure corresponding to the gate electrode of the NMOS transistor TrN, and the surface of the semiconductor substrate 20.

The insulator 64 is provided on the nitride film 63. A top surface of the insulator 64 is aligned with, for example, a top surface of the nitride film 63 provided above the semiconductor layer 41. The insulator 64 is used as an interlayer insulating film in the layer in which the structure corresponding to the gate electrode of the NMOS transistor TrN is formed. The insulator 64 includes, for example, NSG (Non-doped silicate glass).

The nitride film 65, oxide film 66 and insulator 67 are successively provided on the top surface of the insulator 64 and on the top surface of the nitride film 63 that is provided above the semiconductor layer 41. The nitride film 65 includes, for example, silicon nitride (SiN), and is used, for example, as an etching stopper.

The insulator 67 includes, for example, dTEOS. The dTEOS is a silicon oxide which is formed of TEOS (Tetra-ethyl ortho-silicate) by plasma CVD (Chemical vapor deposition). The insulator 67 is used as an interlayer insulating film.

In the above-described structure relating to the NMOS transistor TrN, the contact C0 is formed in a contact hole which penetrates (passes through) the insulator 67, oxide film 66, nitride film 65, nitride film 63, oxide film 62 and insulating layer 43, and a bottom surface of the contact C0 is in contact with the conductive layer 42.

The contact CS is formed in a contact hole which penetrates (passes through) the insulator 67, oxide film 66, nitride film 65, insulator 64, nitride film 63 and oxide film 62, and a bottom surface of the contact CS is in contact with the n+ impurity diffusion region NP1 or NP2.

A top surface of the contact C0 is aligned with, for example, a top surface of the insulator 67. Top surfaces of the contacts CS are aligned with, for example, the top surface of the insulator 67. Specifically, the conductors D0, for example, are provided in an interconnect layer which neighbors the insulator 67.

(Structure of PMOS Transistor TrP)

Next, an example of a more detailed structure of the PMOS transistor TrP will be described.

Figure 7:
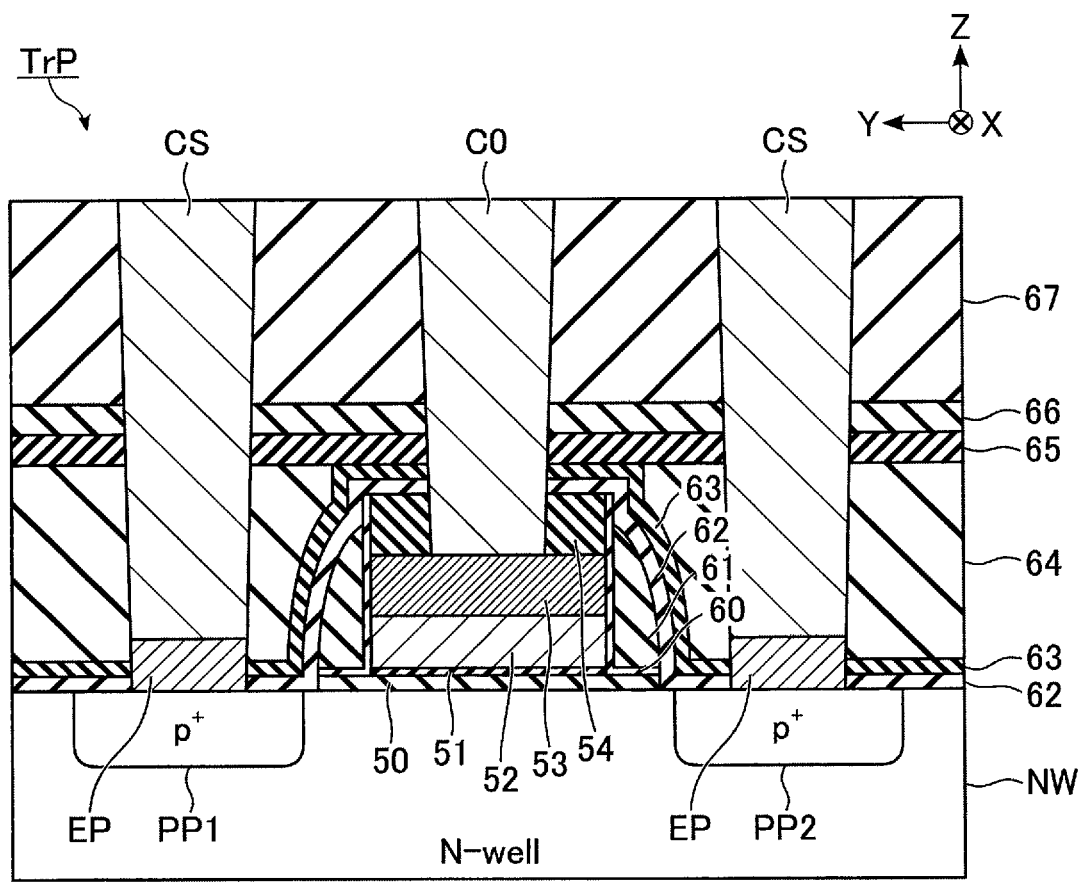
FIG. 7 is a cross-sectional view illustrating an example of a cross-sectional structure of a PMOS transistor under the memory cell array in the semiconductor device according to the first embodiment.

FIG. 7 illustrates an example of a cross-sectional structure of the PMOS transistor TrP under the memory cell array 10 in the semiconductor device 1 according to the first embodiment.

As illustrated in FIG. 7, a region of the PMOS transistor TrP includes the N-well region NW, p+ impurity diffusion regions PP1 and PP2 and contacts CS and C0, which were described with reference to FIG. 4, and includes an oxide film 50, a nitride film 51, a semiconductor layer 52, a conductive layer 53, an insulating layer 54, oxide films 60, 61, 62 and 66, nitride films 63 and 65, insulators 64 and 67, and epitaxial layers EP.

Concretely, the oxide film 50 is provided on the N-well region NW between the p+ impurity diffusion regions PP1 and PP2. The oxide film 50 includes, for example, silicon oxide (SiO$_2$), and is used as a gate insulating film of the PMOS transistor TrP.

The nitride film 51, semiconductor layer 52, conductive layer 53 and insulating layer 54 are successively stacked on the oxide film 50. The nitride film 51 is, for example, silicon nitride (SiN), and prevents impurities, which are doped in the semiconductor layer 52, from diffusing into the semiconductor substrate 20. The semiconductor layer 52 is a P-type semiconductor, and is, for example, polycrystalline silicon which is doped with boron (B).

The conductive layer 53 includes, for example, tungsten silicide (WSi). The insulating layer 54 includes, for example, silicon nitride (SiN). For example, a set of the semiconductor layer 52 and conductive layer 53 is used as a gate electrode (conductor GCp) of the PMOS transistor TrP. The insulating layer 54 is used, for example, as an etching stopper.

The oxide films 60 and 61 are successively provided on a top surface of the oxide film 50 and on side surfaces of the nitride film 51, semiconductor layer 52, conductive layer 53 and insulating layer 54. Each of the oxide films 60 and 61 is used as a side wall of the gate electrode of the PMOS transistor TrP.

The oxide film 62 and nitride film 63, each of which is continuously provided, are successively provided on the top surface and side surface of the structure formed of the oxide film 50, nitride film 51, semiconductor layer 52, conductive layer 53, insulating layer 54 and oxide films 60 and 61, and on the top surface of the N-well region NW. Specifically, the oxide film 62 and nitride film 63 cover the structure corresponding to the gate electrode of the PMOS transistor TrP, and the surface of the semiconductor substrate 20.

The insulator 64 is provided on the nitride film 63. A top surface of the insulator 64 is aligned with, for example, a top surface of the nitride film 63 provided above the semiconductor layer 52. The nitride film 65, oxide film 66 and insulator 67 are successively provided on the top surface of the insulator 64 and on the top surface of the nitride film 63 that is provided above the semiconductor layer 52.

In the above-described structure relating to the PMOS transistor TrP, the contact C0 is formed in a contact hole which penetrates (passes through) the insulator 67, oxide film 66, nitride film 65, nitride film 63, oxide film 62 and insulating layer 54, and a bottom surface of the contact C0 is in contact with the conductive layer 53.

The contact CS is formed in a contact hole which penetrates (passes through) the insulator 67, oxide film 66, nitride film 65, insulator 64, nitride film 63 and oxide film 62, and a bottom surface of the contact CS is in contact with the epitaxial layer EP.

The epitaxial layer EP is provided in a columnar shape on each of the $p^+$ impurity diffusion regions PP1 and PP2. Hereinafter, a portion, in which the contact CS and the $p^+$ impurity diffusion region PP (PP1 or PP2) are electrically connected, is referred to as "contact portion". For example, in a circuit configuration or the like in which PMOS transistors TrP neighboring on the semiconductor substrate 20 are connected with the $p^+$ impurity diffusion region PP being shared, the contact CS is not necessarily provided on the shared $p^+$ impurity diffusion region PP. In this manner, the contact portion, which will be illustrated below, is not limited to the case in which the contact portion is provided on each of the $p^+$ impurity diffusion regions PP1 and PP2. Specifically, the contact portion may be applied to one of the $p^+$ impurity diffusion regions PP1 and PP2, and the same applies to the configuration of the contact CS which is formed on the $n^+$ impurity diffusion region NP of the NMOS transistor TrN.

Figure 8:
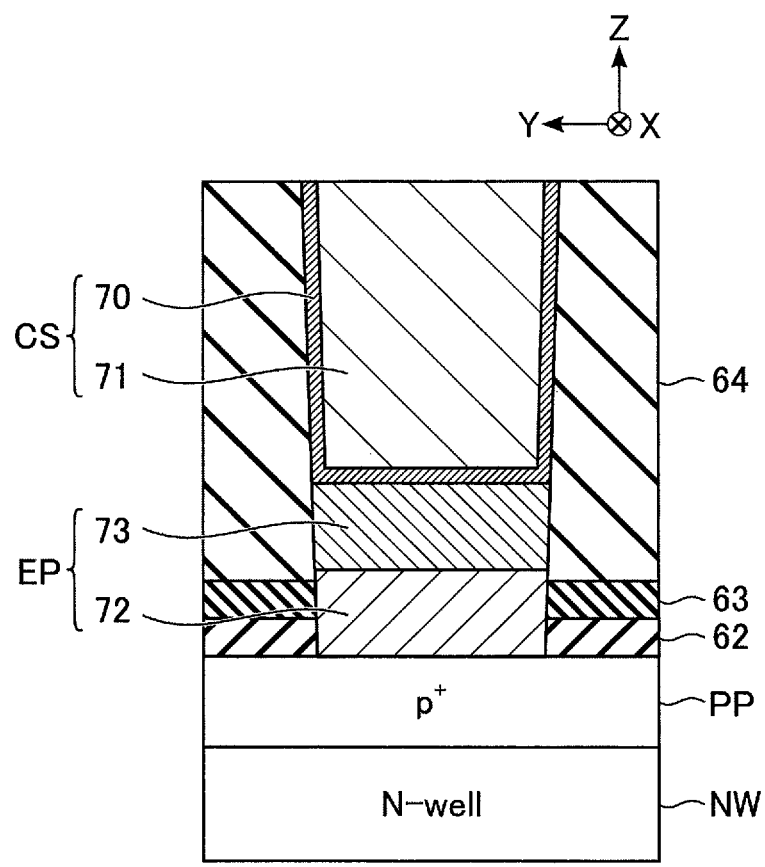
FIG. 8 is a cross-sectional view illustrating an example of a more detailed cross-sectional structure of a contact portion of the PMOS transistor in the semiconductor device according to the first embodiment.

FIG. 8 illustrate an example of a more detailed cross-sectional structure of the contact portion of the PMOS transistor TrP in the semiconductor device 1 according to the first embodiment.

As illustrated in FIG. 8, the contact CS includes, for example, conductors 70 and 71, and the epitaxial layer EP includes, for example, semiconductor layers 72 and 73.

The conductor 70 includes a portion provided on the epitaxial layer EP, and a portion extending in a cylindrical shape from this portion. In other words, the conductor 70 is provided on an inner wall and a bottom surface of the contact hole having a bottom portion in which the epitaxial layer EP is disposed, and the conductor 70 is in contact with the epitaxial layer EP.

The conductor 70 includes, for example, titanium nitride (TIN), and is used as a barrier metal in the manufacturing process of the semiconductor device 1. The conductor 71 is buried, for example, in the inside of the conductor 70. The conductor 71 includes, for example, tungsten (W).

This detailed structure of the contact CS corresponding to the PMOS transistor TrP is similar to the structure of each of the contacts CS and C0 corresponding to the NMOS transistor TrN and the contact C0 corresponding to the PMOS transistor TrP.

The semiconductor layers 72 and 73 are successively stacked on the $p^+$ impurity diffusion region PP. In other words, the semiconductor layer 72 is provided on the $p^+$ impurity diffusion region PP. The semiconductor layer 73 is provided on the semiconductor layer 72. The contact CS is in contact with a top surface of the semiconductor layer 73.

Each of the semiconductor layers 72 and 73 is a single-crystal semiconductor which is formed by epitaxial growth. The semiconductor layer 72 is, for example, non-doped silicon (Si). The semiconductor layer 72 may include impurities (e.g. boron). In this case, the impurity concentration of the semiconductor layer 72 is designed to become equal to or lower than the impurity concentration of the $p^+$ impurity diffusion region PP. The impurities doped in the semiconductor layer 72 may be doped when the semiconductor layer 72 is formed, or may be doped by impurity diffusion from the $p^+$ impurity diffusion region PP or semiconductor layer 73.

The semiconductor layer 73 is, for example, silicon (Si) doped with boron (B), or silicon (Si) doped with boron (B) and carbon (C). The boron concentration in the semiconductor layer 73 is, for example, $10^{19}$ (atoms/cm$^3$) or more. The carbon concentration in the semiconductor layer 73 in the case where carbon is doped is, for example, $10^{19}$ (atoms/cm$^3$) or more, and is designed like the boron concentration.

Note that in the semiconductor layer 73, a preferable boron concentration is on the order of $10^{21}$ (atoms/cm$^3$), and a preferable carbon concentration is on the order of $10^{21}$ (atoms/cm$^3$). As the boron concentration in the part in which the contact CS and epitaxial layer EP are put in contact becomes higher, the contact resistance between the contact CS and epitaxial layer EP becomes lower.

[1-2] Manufacturing Method of Semiconductor Device 1

Hereinafter, referring to FIG. 9 to FIG. 13, a description is given of an example of a series of manufacturing steps from the formation of the NMOS transistor TrN and PMOS transistor TrP to the formation of the contacts CS and C0 in the first embodiment.

Each of FIG. 9 to FIG. 13 illustrates an example of the cross-sectional structure including the structure corresponding to the NMOS transistor TrN and PMOS transistor TrP in the manufacturing steps of the semiconductor device 1 according to the first embodiment.

To begin with, as illustrated in FIG. 9, an NMOS transistor TrN and a PMOS transistor TrP are formed. The structure of the NMOS transistor TrN illustrated in FIG. 9 is the same as the structure in which the contacts CS and C0 are omitted from the structure of the NMOS transistor TrN described with reference to FIG. 6. The structure of the PMOS transistor TrP illustrated in FIG. 9 is the same as the structure in which the contacts CS and C0 and epitaxial layers EP are omitted from the structure of the PMOS transistor TrP described with reference to FIG. 7.

Next, as illustrated in FIG. 10, contact holes CHp1 corresponding to the contacts CS of the PMOS transistor TrP are formed. As an etching method in this manufacturing step, for example, anisotropic etching such as reactive ion etching (RIE) is used.

In this manufacturing step, the contact hole CHp1 penetrates the insulator 67, oxide film 66, nitride film 65, insulator 64, nitride film 63 and oxide film 62. In addition, the surface of the $p^+$ impurity diffusion region PP is exposed at a bottom portion of the contact hole CHp1.

Figure 11:
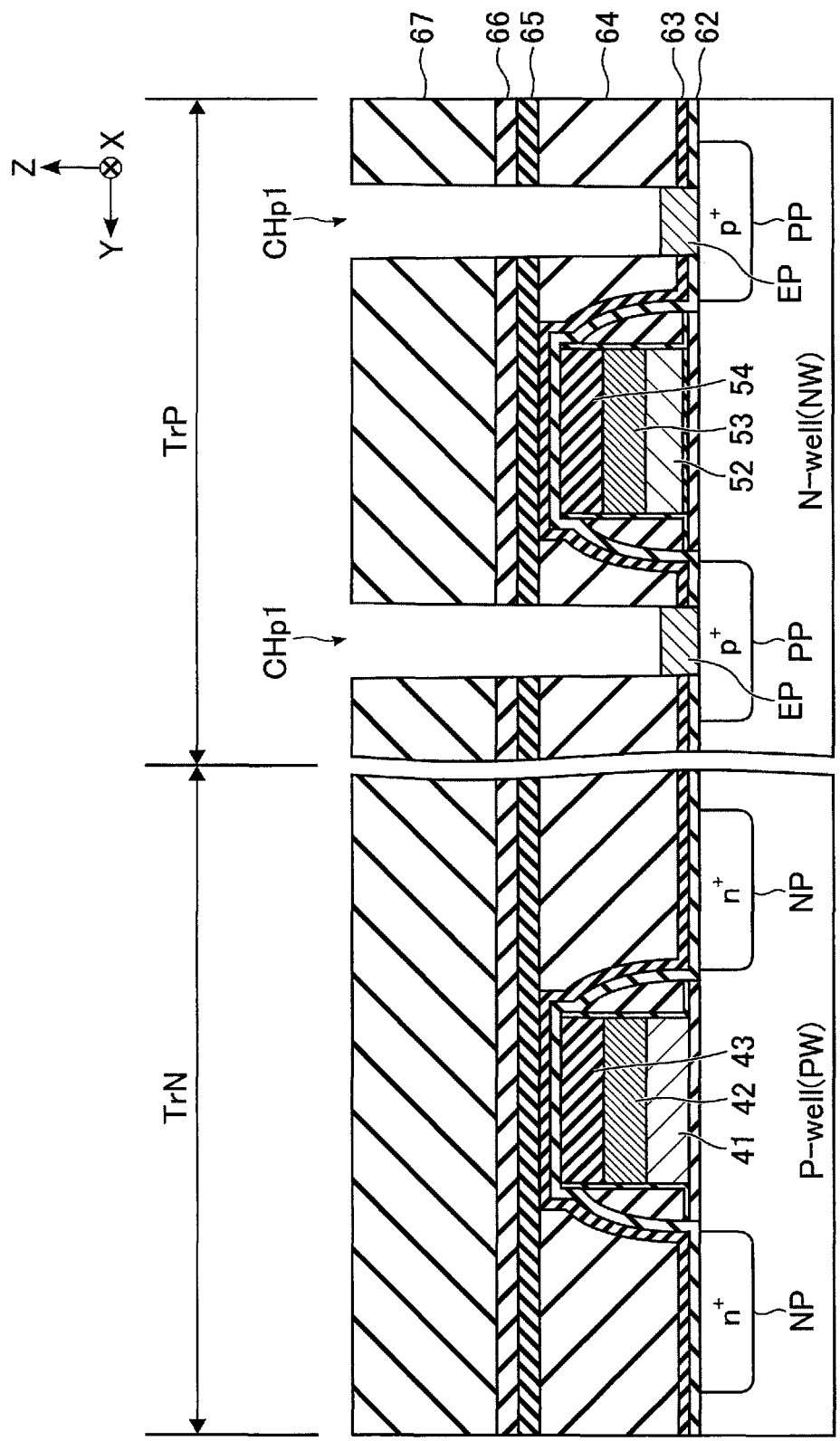

Subsequently, as illustrated in FIG. 11, epitaxial layers EP are formed in bottom portions of the contact holes CHp1. Concretely, for example, epitaxial growth is performed based on silicon (Si) in the N-well region NW, and single-crystal silicon is formed on the top surface of the p impurity diffusion region PP. The epitaxial layer EP formed in this manufacturing step is doped with impurities as appropriate, for example, as described with reference to FIG. 8.

Figure 12:
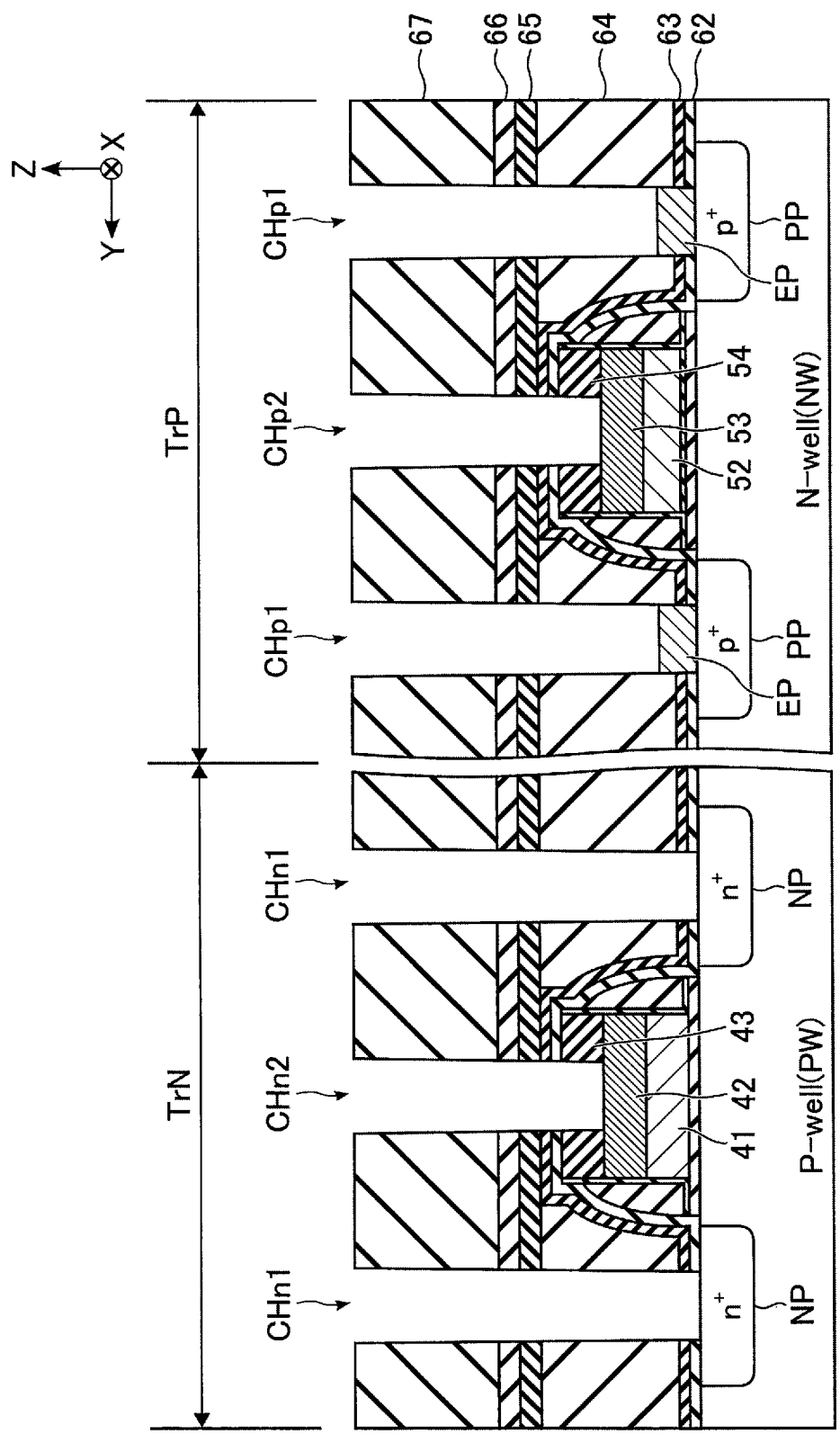

Next, as illustrated in FIG. 12, contact holes CHn1 and CHn2 corresponding to the contacts CS and C0 of the NMOS transistor TrN, and a contact hole CHp2 corresponding to the contact C0 of the PMOS transistor TrP are formed. As an etching method in this manufacturing step, for example, anisotropic etching such as RIE is used.

In this manufacturing step, the contact hole CHn1 penetrates the insulator 67, oxide film 66, nitride film 65, insulator 64, nitride film 63 and oxide film 62. In addition, the surface of the $n^+$ impurity diffusion region NP is exposed at a bottom portion of the contact hole CHn1.

The contact hole CHn2 penetrates the insulator 67, oxide film 66, nitride film 65, nitride film 63, oxide film 62 and insulating layer 43. In addition, the surface of the conductive layer 42 is exposed at a bottom portion of the contact hole CHn2.

The contact hole CHp2 penetrates the insulator 67, oxide film 66, nitride film 65, nitride film 63, oxide film 62 and insulating layer 54. In addition, the surface of the conductive layer 53 is exposed at a bottom portion of the contact hole CHp2.

Figure 13:
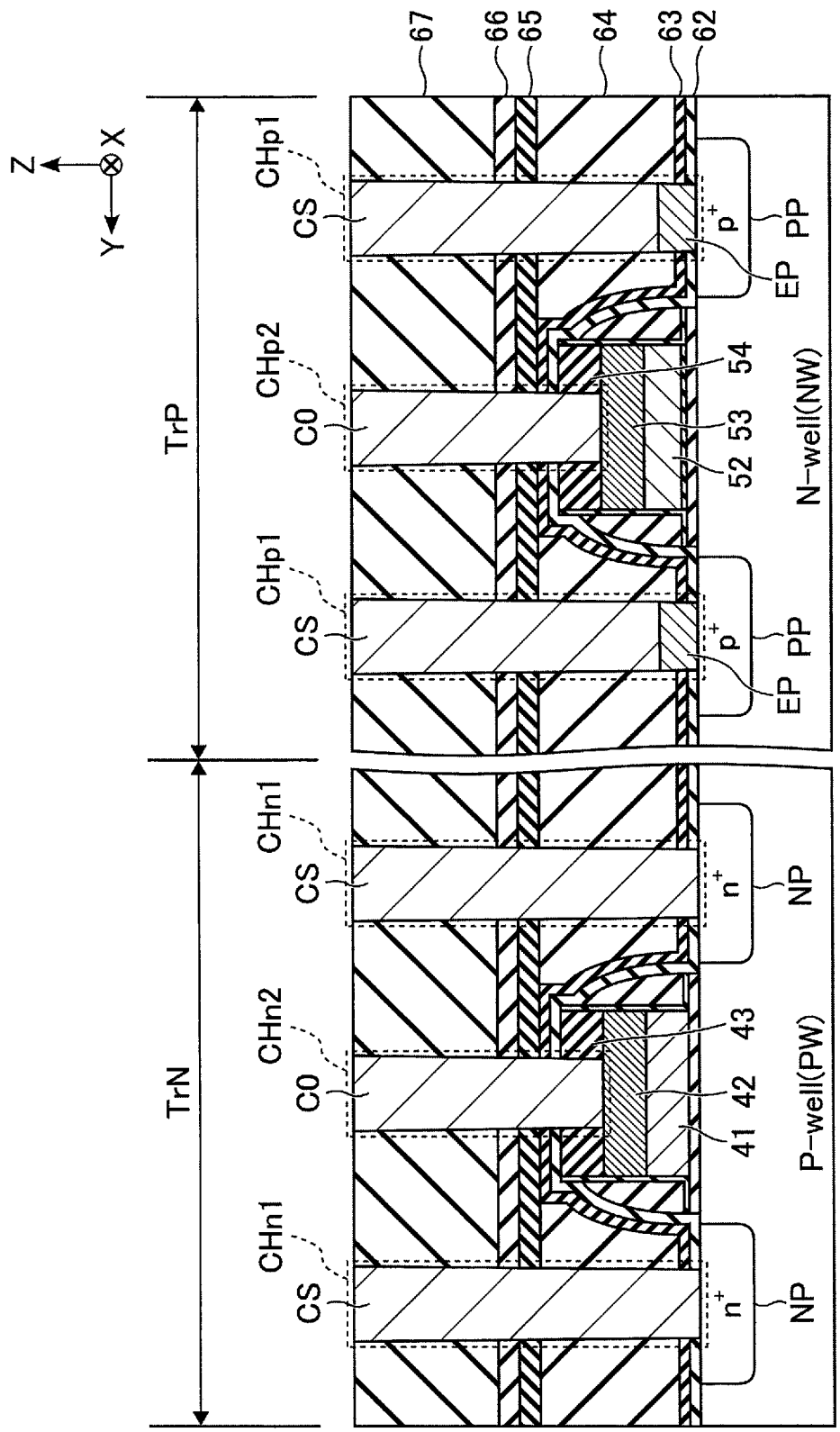

Next, as illustrated in FIG. 13, contacts CS and C0 corresponding to the NMOS transistor TrN and contacts CS and C0 corresponding to the PMOS transistor TrP are formed.

Concretely, for example, by chemical vapor deposition (CVD), conductors 70 and 71 are successively formed, and the conductor 71 is buried in each of the contact holes CHn1, CHn2, CHp1 and CHp2.

Then, the conductors 70 and 71, which are provided in a layer above the top surface of the insulator 67, are removed by, for example, chemical mechanical polishing (CMP), and the top surfaces of the conductors 70 and 71 formed in the contact holes CHn1, CHn2, CHp1 and CHp2 and the top surface of the insulator 67 are planarized.

As a result, the contact CS having the bottom surface put in contact with the $n^+$ impurity diffusion region NP is formed in the contact hole CHn1. The contact C0 having the bottom surface put in contact with the conductive layer 42 is formed in the contact hole CHn2.

The contact CS having the bottom surface put in contact with the epitaxial layer EP is formed in the contact hole CHp1. The contact C0 having the bottom surface put in contact with the conductive layer 53 is formed in the contact hole CHp2.

As described above, in the manufacturing method of the semiconductor device 1 according to the first embodiment, the structure of the NMOS transistor TrN described with reference to FIG. 6 and the structure of the PMOS transistor TrP described with reference to FIG. 7 are formed.

[1-3] Advantageous Effects of the First Embodiment

Hereinafter, the advantageous effects of the semiconductor device 1 according to the first embodiment will be described in detail.

In the semiconductor device in which memory cells are stacked three-dimensionally, a circuit such as a sense amplifier module may be disposed under the memory cell array in order to suppress an increase in chip area. In the manufacturing process of the semiconductor device with this structure, the memory cell array is formed after the formation of the circuit such as the sense amplifier module.

However, in the semiconductor device with this structure, there is a possibility that the characteristics of the transistors provided under the memory cell array deteriorate due to heat treatment at a time when the memory cell array is formed. For example, by this heat treatment, impurities in the impurity diffusion region corresponding to the source or drain of the transistor may diffuse into the contact that is connected to this impurity diffusion region.

If impurities diffuse into the contact, the impurity concentration in the impurity diffusion region lowers, and it is possible that the contact resistance between the contact and the impurity diffusion region increases. This phenomenon tends to easily occur, in particular, in the contact which is connected to the $p^+$ impurity diffusion region that is doped with boron.

As a countermeasure to this, it is effective to set the dosage of boron at a high concentration in the $p^+$ impurity diffusion region corresponding to the PMOS transistor. Thereby, even when boron diffuses into the contact, boron with a high concentration can be maintained in the impurity diffusion region.

On the other hand, if the dosage of boron in the $p^+$ impurity diffusion region is set at a high concentration, it is possible that the $p^+$ impurity diffusion region in the N-well region may expand by heat treatment. If the $p^+$ impurity diffusion region expands, the distance between the gate electrode and the $p^+$ impurity diffusion region becomes shorter and, hence, there is a possibility that the short channel characteristic of the transistor deteriorates.

Taking the above into account, the semiconductor device 1 according to the first embodiment has such a structure that the impurity concentration in the p impurity diffusion region PP is designed at an appropriate concentration for the short channel characteristic, and that the $p^+$ impurity diffusion region PP corresponding to the PMOS transistor TrP and the contact CS are electrically connected via the epitaxial layer EP.

Concretely, the epitaxial layer EP includes the semiconductor layer 73, which is doped with boron at a high concentration, for example, at the part where the epitaxial layer EP is put in contact with the contact CS, and includes the semiconductor layer 72, which is non-doped or doped with boron at a low concentration, at the part where the epitaxial layer EP is put in contact with the $p^+$ impurity diffusion region PP.

When heat treatment at a time of forming the memory cell array is performed on this structure, the expansion of the $p^+$ impurity diffusion region PP can be suppressed since the semiconductor layer 73, which is doped with boron at a high concentration, is formed spaced apart from the $p^+$ impurity diffusion region PP.

In addition, as regards the semiconductor layer 72 which is formed in contact with the $p^+$ impurity diffusion region PP, since the semiconductor layer 72 is the single-crystal semiconductor formed by epitaxial growth, there occurs no impurity diffusion via a grain boundary as in the case in which polycrystalline silicon is used.

Thus, diffusion of boron from the semiconductor layer 73, which is doped with boron at a high concentration, into the $p^+$ impurity diffusion region PP can be suppressed. As a result, it is possible to prevent the impurity concentration of the p⁺ impurity diffusion region PP from increasing higher than a design value, and to prevent the p⁺ impurity diffusion region PP from expanding.

In addition, even if the boron doped in the semiconductor layer 73 diffuses into the contact CS, the boron concentration in the semiconductor layer 73 can be kept high. Further, the carbon doped in the semiconductor layer 73 suppresses diffusion of the boron doped in the semiconductor layer 73.

Moreover, although the boron in the p impurity diffusion region PP may diffuse into the epitaxial layer EP, the diffusion amount of impurities into the single-crystal semiconductor is less than the diffusion amount of impurities into the contact CS in the case in which the p impurity diffusion region PP and contact CS are put in direct contact.

As a result, the semiconductor device 1 according to the first embodiment can suppress an increase in contact resistance between the contact CS and semiconductor layer 73, and can suppress a decrease in short channel characteristic of the PMOS transistor TrP and a variation in impurity concentration of the p⁺ impurity diffusion region PP. Therefore, the semiconductor device 1 according to the first embodiment can suppress a variation in characteristics of the transistors.

Besides, when the semiconductor layer 72 is doped with boron at a concentration which is equal to or less than the impurity concentration in the p⁺ impurity diffusion region PP, the gradient of impurity concentration between the semiconductor layer 72 and p⁺ impurity diffusion region PP becomes smaller, and also the gradient of impurity concentration between the semiconductor layer 73 and semiconductor layer 72 becomes smaller.

In this case, in the heat treatment at the time of forming the memory cell array, since the diffusion of impurities from the p⁺ impurity diffusion region PP into the semiconductor layer 72 can be suppressed, the variation in impurity concentration in the p impurity diffusion region PP can further be suppressed. Similarly, since the diffusion of impurities from the semiconductor layer 73 into the semiconductor layer 72 can be suppressed, the variation in impurity concentration in the semiconductor layer 73 can also be suppressed.

Thereby, the semiconductor device 1 according to the first embodiment can suppress a variance in characteristics in PMOS transistors TrP, and can suppress an increase in contact resistance between the contact CS and p⁺ impurity diffusion region PP.

As described above, in the semiconductor device 1 according to the first embodiment, the epitaxial layer EP and contact CS are used for the connection between the p impurity diffusion region PP and the conductor D0. The resistance value is smaller in the contact CS which is formed of a metal, than in the epitaxial layer EP which is formed of a semiconductor.

Thus, in the semiconductor device 1 according to the first embodiment, the epitaxial layer EP is formed such that at least the above-described advantageous effects can be obtained, and the ratio of the contact CS, which is formed of a metal, is increased. Thereby, an increase in resistance value between the p⁺ impurity diffusion region PP and the conductor D0 can be suppressed.

[1-4] Modifications of the First Embodiment

In the first embodiment, the case was illustrated in which the epitaxial layer EP including the semiconductor layers 72 and 73 is formed at the bottom portion of the contact CS corresponding to the PMOS transistor TrP. However, the layer structure of the epitaxial layer EP may be a different structure.

Hereinafter, other structure examples of the epitaxial layer EP will be described.

Figure 14:
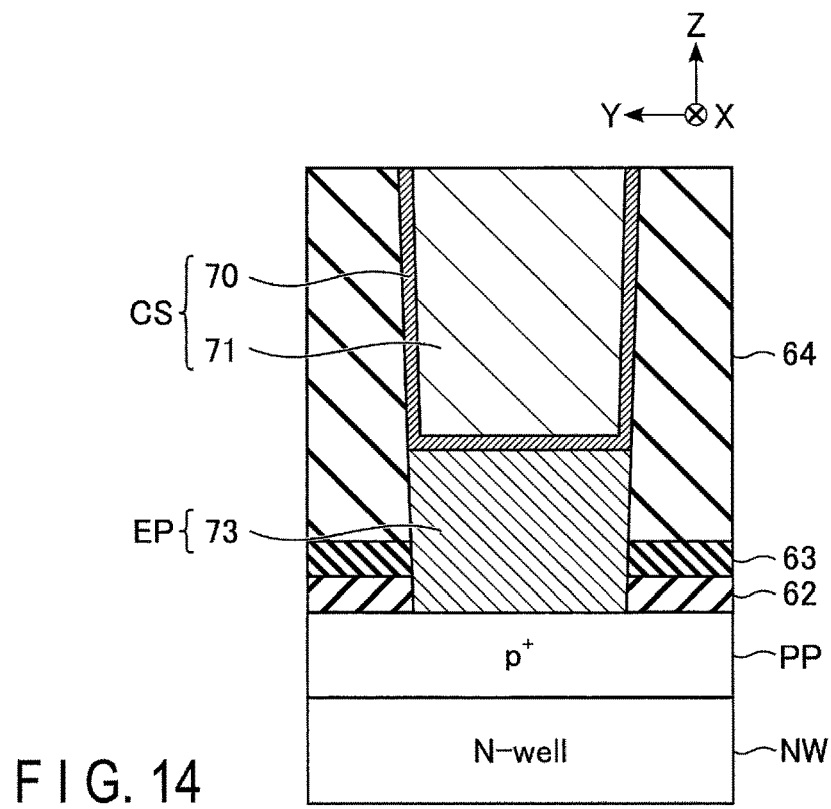
FIG. 14 is a cross-sectional view illustrating an example of a more detailed cross-sectional structure of a contact portion of a PMOS transistor in a first modification of the first embodiment.

FIG. 14 illustrates an example of a more detailed cross-sectional structure of a contact portion of a PMOS transistor TrP in a first modification of the first embodiment.

As illustrated in FIG. 14, in the first modification of the first embodiment, the epitaxial layer EP includes a semiconductor layer 73 which is doped with boron (B) and carbon (C). A bottom surface of the semiconductor layer 73 is in contact with the p⁺ impurity diffusion region PP. A top surface of the semiconductor layer 73 is in contact with the contact CS.

Specifically, in the first modification of the first embodiment, the entirety of the epitaxial layer EP is formed of silicon (Si) which is doped with boron (B) and carbon (C).

Like the first embodiment, this structure can suppress an increase in contact resistance between the contact CS and p⁺ impurity diffusion region PP in the PMOS transistor TrP.

In addition, in the first modification of the first embodiment, the semiconductor layer 73 doped with impurities at a high concentration is in contact with the p⁺ impurity diffusion region PP. However, the carbon doped in the semiconductor layer 73 can suppress diffusion of the boron doped in the semiconductor layer 73 into the p⁺ impurity diffusion region PP.

As a result, it is possible to prevent the impurity concentration in the p⁺ impurity diffusion region PP from increasing higher than a design value, and to prevent the p⁺ impurity diffusion region PP in the N-well region NW from expanding.

Therefore, the first modification of the first embodiment can suppress degradation of the short channel characteristic, and can suppress a variance in performance of PMOS transistors TrP.

Figure 15:
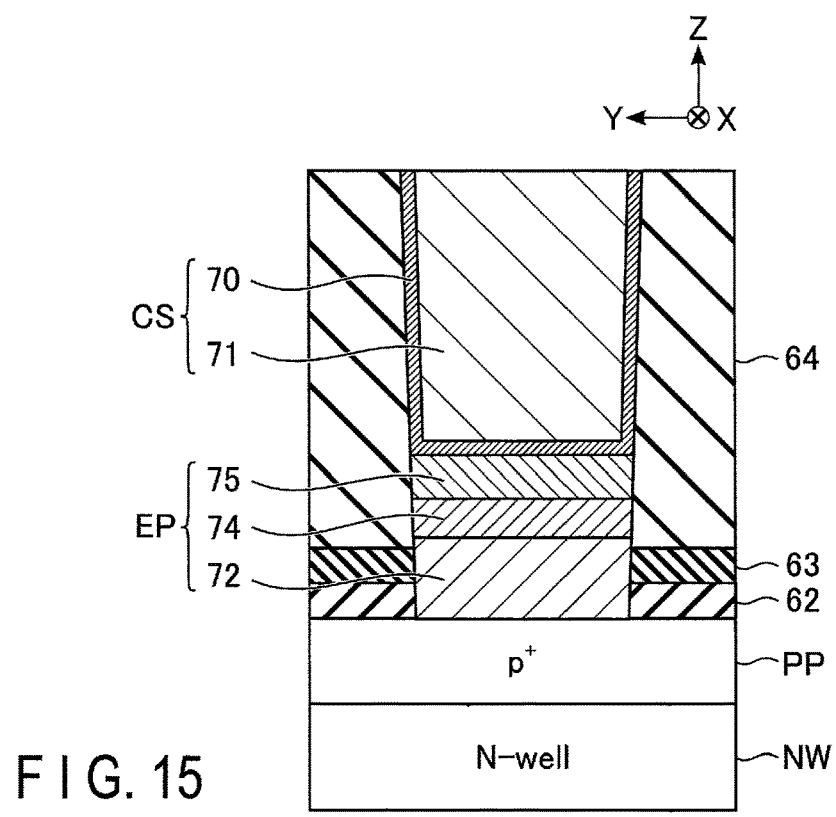
FIG. 15 is a cross-sectional view illustrating an example of a more detailed cross-sectional structure of a contact portion of a PMOS transistor in a second modification of the first embodiment.

FIG. 15 illustrates an example of a more detailed cross-sectional structure of a contact portion of a PMOS transistor TrP in a second modification of the first embodiment.

As illustrated in FIG. 15, in the second modification of the first embodiment, the epitaxial layer EP includes semiconductor layer 72, 74 and 75. The semiconductor layer 72, 74 and 75 are successively stacked on the p⁺ impurity diffusion region PP.

In other words, the semiconductor layer 72 is provided on the p⁺ impurity diffusion region PP. The semiconductor layer 74 is provided on the semiconductor layer 72. The semiconductor layer 75 is provided on the semiconductor layer 74. The contact CS is in contact with a top surface of the semiconductor layer 75.

Each of the semiconductor layers 74 and 75 is a single-crystal semiconductor which is formed by epitaxial growth. The semiconductor layer 74 is, for example, silicon (Si) doped with carbon (C). The semiconductor layer 75 is, for example, silicon (Si) doped with boron (B).

The carbon concentration in the semiconductor layer 74 is, for example, $10^{19}$ (atoms/cm³) or more. The boron concentration in the semiconductor layer 75 is, for example, $10^{19}$ (atoms/cm³) or more. Note that a preferable carbon concentration in the semiconductor layer 74 is on the order of $10^{21}$ (atoms/cm³), and a preferable boron concentration in the semiconductor layer 75 is on the order of $10^{21}$ (atoms/cm³).

As described above, in the epitaxial layer EP in the second modification of the first embodiment, the semiconductor layer 72 which is non-doped or has an impurity concentration equal to or less than the impurity concentration in the $p^+$ impurity diffusion region PP, the semiconductor layer 74 which is doped with carbon, and the semiconductor layer 75 which is doped with boron, are successively stacked.

In this structure, since the semiconductor layer 75 doped with boron at a high concentration is put in contact with the contact CS, an increase in contact resistance between the semiconductor layer 75 and contact CS can be suppressed. In addition, since the semiconductor layer 74 doped with carbon is provided between the semiconductor layer 72 and semiconductor layer 75, diffusion of boron from the semiconductor layer 75 into the semiconductor layer 72 can be suppressed.

Specifically, like the first embodiment, the structure of the epitaxial layer EP in the second modification of the first embodiment can suppress an increase in contact resistance between the contact CS and the p impurity diffusion region PP in the PMOS transistor TrP, and can suppress degradation of the short channel characteristic.

Therefore, the second modification of the first embodiment can suppress a variance in performance of PMOS transistors TrP.

Also in the second modification of the first embodiment, there is a possibility that diffusion of impurities occurs, for example, at an interface between the semiconductor layer 74 and semiconductor layer 75 due to the heat treatment at the time of forming the memory cell array, and slight diffusion of impurities through layers is tolerable.

[2] Second Embodiment

In a semiconductor device 1 according to a second embodiment, a structure, which can obtain the same advantageous effects as the semiconductor device 1 according to the first embodiment, is formed by a less number of manufacturing steps than in the first embodiment.

Hereinafter, as regards the semiconductor device 1 according to the second embodiment, different points from the first embodiment will be described.

[2-1] Structure of NMOS Transistor TrN

FIG. 16 illustrates an example of a cross-sectional structure of an NMOS transistor TrN under the memory cell array 10 in the semiconductor device 1 according to the second embodiment.

As illustrated in FIG. 16, the region including the NMOS transistor TrN in the second embodiment has, for example, such a structure that a nitride film 80 is added to the structure described with reference to FIG. 6 in the first embodiment.

Concretely, the nitride film 80 is provided on a top surface and a side surface of the nitride film 63. In other words, the nitride film 80 includes a portion extending along the surface of the P-well region PW, and a portion extending along the side wall of the gate electrode of the NMOS transistor TrN.

For example, the film thickness of the nitride film 80 is greater than the film thickness of the nitride film 63. The nitride film 80 includes, for example, silicon nitride (SiN), and is formed of the same material as the nitride film 63.

The nitride film 80 may be provided on the nitride film 63 at least above the $n^+$ impurity diffusion regions NP1 and NP2, and may be or may not be provided on the nitride film 63 above the semiconductor layer 41.

In the second embodiment, the contact CS corresponding to the NMOS transistor TrN penetrates (passes through) the nitride film 80. The contact C0 corresponding to the NMOS transistor TrN may penetrate or may not penetrate the nitride film 80.

The other structure of the semiconductor device 1 according to the above-described second embodiment is the same as the structure of the semiconductor device 1 according to the first embodiment. Specifically, in the second embodiment, the total film thickness of the nitride (silicon nitride), which is provided above the impurity diffusion regions and can be used as an etching stopper, is designed to be greater in the NMOS transistor TrN than in the PMOS transistor TrP.

[2-2] Manufacturing Method of Semiconductor Device 1

Hereinafter, referring to FIG. 17 to FIG. 26, a description is given of an example of a series of manufacturing steps from the formation of the NMOS transistor TrN and PMOS transistor TrP to the formation of the contacts CS and C0 in the second embodiment.

Each of FIG. 17 to FIG. 26 illustrates an example of the cross-sectional structure including the structure corresponding to the NMOS transistor TrN and PMOS transistor TrP in the manufacturing steps of the semiconductor device 1 according to the second embodiment.

Figure 17:
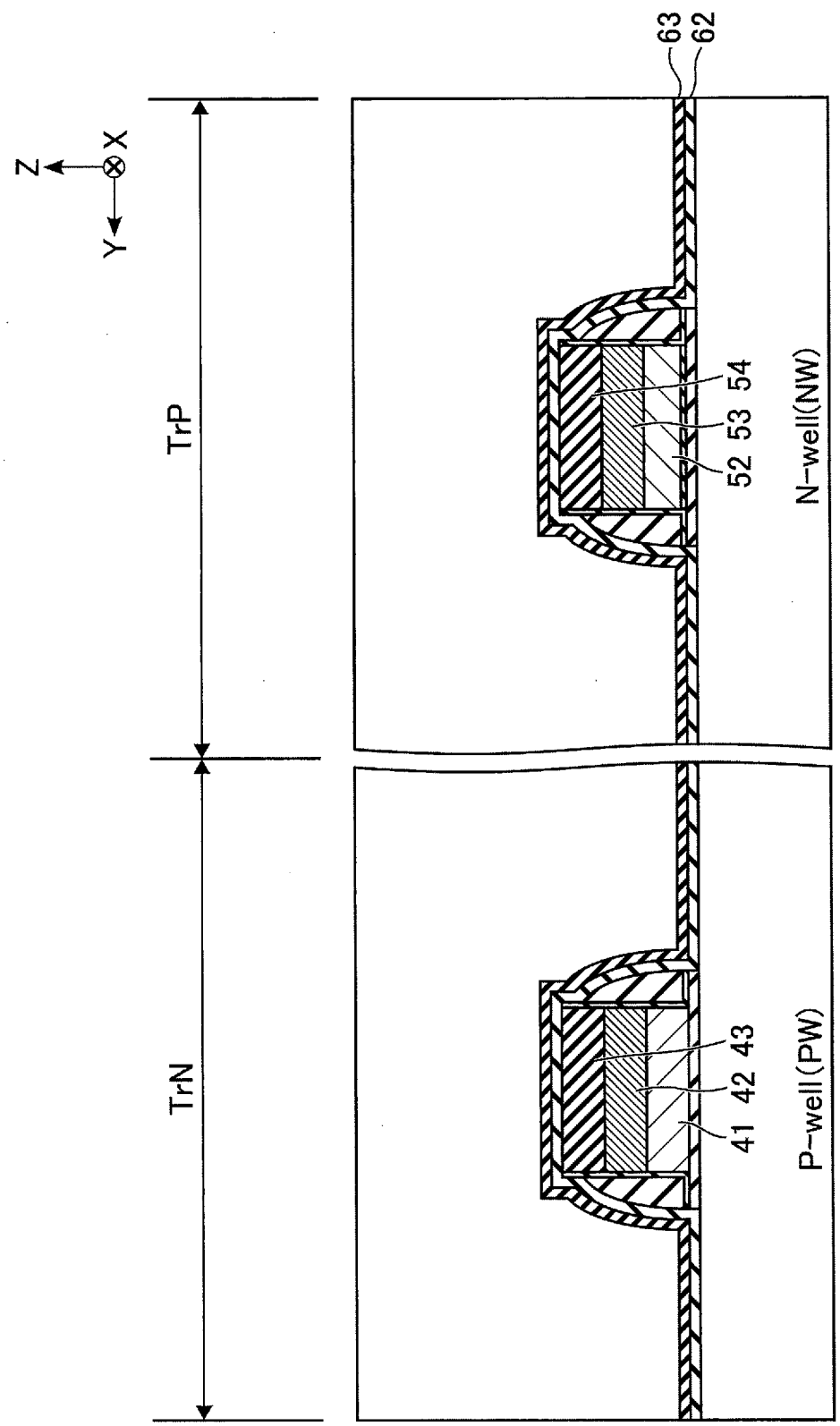

To begin with, as illustrated in FIG. 17, a gate electrode of an NMOS transistor TrN and a gate electrode of a PMOS transistor TrP are formed. The structure illustrated in FIG. 17 is the same as the structure in which the insulator 64, nitride film 65, oxide film 66 and insulator 67 are omitted from the structure described with reference to FIG. 9 in the first embodiment.

Next, as illustrated in FIG. 18, $n^+$ impurity diffusion regions NP corresponding to the NMOS transistor TrN are formed. Concretely, to begin with, by photolithography, a region corresponding to the NMOS transistor TrN is opened, and a resist REG covering a region corresponding to the PMOS transistor TrP is formed.

Then, an ion implantation process is executed by using the resist REG as a mask, and N-type impurities (e.g. phosphorus) are implanted in a surface portion of the P-well region PW via the opening portion of the resist REG, nitride film 63 and oxide film 62.

Thereafter, for example, the resist REG is removed, and heat treatment is performed. Then, in the P-well region PW, the regions in which the N-type impurities were implanted are recrystallized, and $n^+$ impurity diffusion regions NP are formed in the P-well region PW.

Figure 19:
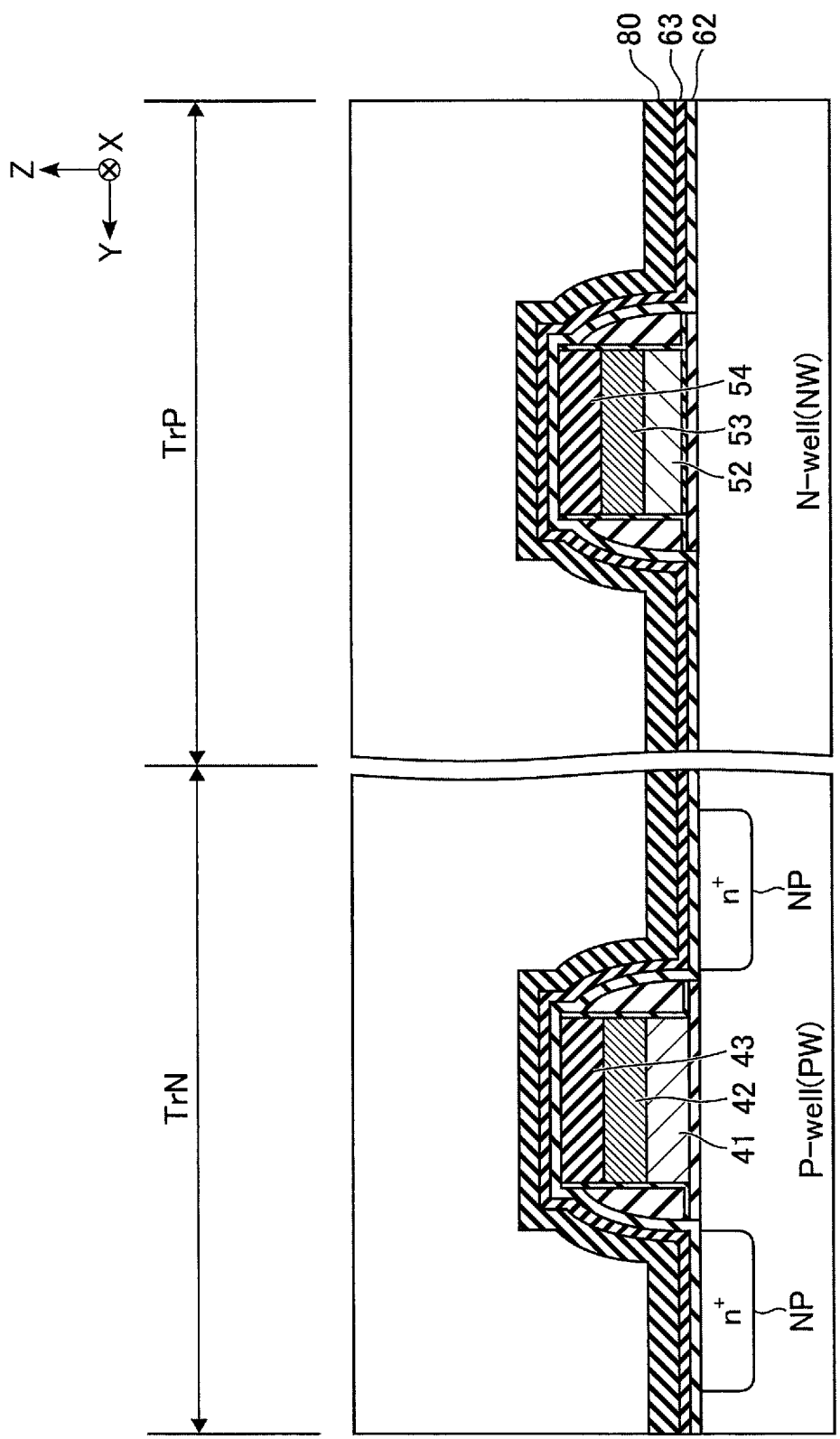

Next, as illustrated in FIG. 19, a nitride film 80 is formed in each of the region of the NMOS transistor TrN and the region of the PMOS region TrP.

Subsequently, as illustrated in FIG. 20, the nitride film 80 formed in the region of the PMOS transistor TrP is removed. Concretely, to begin with, by photolithography, a region corresponding to the PMOS transistor TrP is opened, and a resist REG covering a region corresponding to the NMOS transistor TrN is formed.

Then, an etching process is executed by using the resist REG as a mask, and the nitride film 80 formed in the region of the PMOS transistor TrP is removed. Note that the resist REG formed in this manufacturing step can also be used in a subsequent step.

Figure 21:
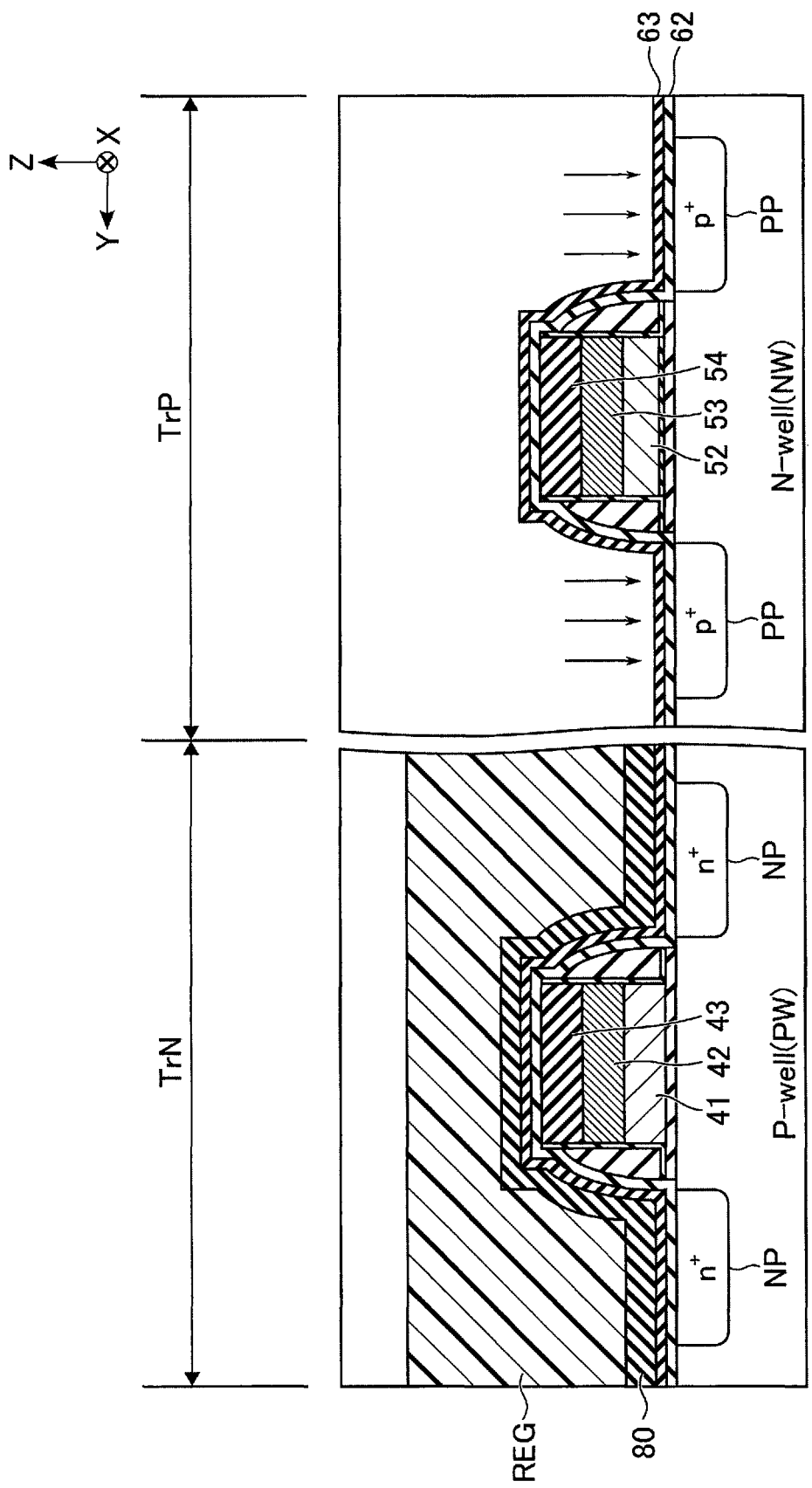

Next, as illustrated in FIG. 21, $p^+$ impurity diffusion regions PP corresponding to the PMOS transistor TrP are formed. Concretely, an ion implantation process is executed by using as a mask the resist REG formed in the manufacturing step corresponding to FIG. 20, and P-type impurities (e.g. boron) are implanted in a surface portion of the N-well region NW via the opening portion of the resist REG, nitride film 63 and oxide film 62.

Thereafter, for example, the resist REG is removed, and heat treatment is performed. Then, in the N-well region NW, the regions in which the P-type impurities were implanted are recrystallized, and p⁺ impurity diffusion regions PP are formed in the N-well region NW.

Next, as illustrated in FIG. 22, an insulator 64, a nitride film 65, an oxide film 66 and an insulator 67 are formed. The structure of the NMOS transistor TrN illustrated in FIG. 22 is the same as the structure in which the contacts CS and C0 are omitted from the structure of the NMOS transistor TrN described with reference to FIG. 16. The structure of the PMOS transistor TrP illustrated in FIG. 22 is the same as the structure in which the contacts CS and C0 and epitaxial layers EP are omitted from the structure of the PMOS transistor TrP described with reference to FIG. 7 in the first embodiment.

Subsequently, as illustrated in FIG. 23, contact holes CHn1 and CHn2 corresponding to the NMOS transistor TrN and contact holes CHp1 and CHp2 corresponding to the PMOS transistor TrP are formed. As an etching method in this manufacturing step, for example, anisotropic etching such as reactive ion etching (RIE) is used.

In this manufacturing step, the contact hole CHn1 penetrates the insulator 67, oxide film 66, nitride film 65 and insulator 64. In addition, a bottom portion of the contact hole CHn1 stops, for example, in a layer provided with the nitride film 80.

The contact hole CHn2 penetrates the insulator 67, oxide film 66, nitride film 65, nitride film 63 and oxide film 62. In addition, a bottom portion of the contact hole CHn2 stops, for example, in a layer provided with the insulating layer 43.

The contact hole CHp1 penetrates the insulator 67, oxide film 66, nitride film 65, insulator 64, nitride film 63 and oxide film 62. In addition, the surface of the p⁺ impurity diffusion region PP is exposed at a bottom portion of the contact hole CHp1.

The contact hole CHp2 penetrates the insulator 67, oxide film 66, nitride film 65, nitride film 63 and oxide film 62. In addition, a bottom portion of the contact hole CHp2 stops, for example, in a layer in which the insulating layer 54 is formed.

Next, as illustrated in FIG. 24, epitaxial layers EP are formed in bottoms of the contact holes CHp1. This manufacturing step is the same as the manufacturing step described with reference to FIG. 11 in the first embodiment.

Subsequently, as illustrated in FIG. 25, the bottom portions of the contact holes CHn1, CHn2 and CHp2 are etched. As an etching method in this manufacturing step, for example, anisotropic etching such as reactive ion etching (RIE) is used.

Thereby, the surfaces of the n⁺ impurity diffusion regions NP are exposed in the bottoms of the contact holes CHn1, the surface of the conductive layer 42 is exposed in the bottom portion of the contact hole CHn2, and the surface of the conductive layer 53 is exposed in the bottom portion of the contact hole CHp2.

Figure 26:
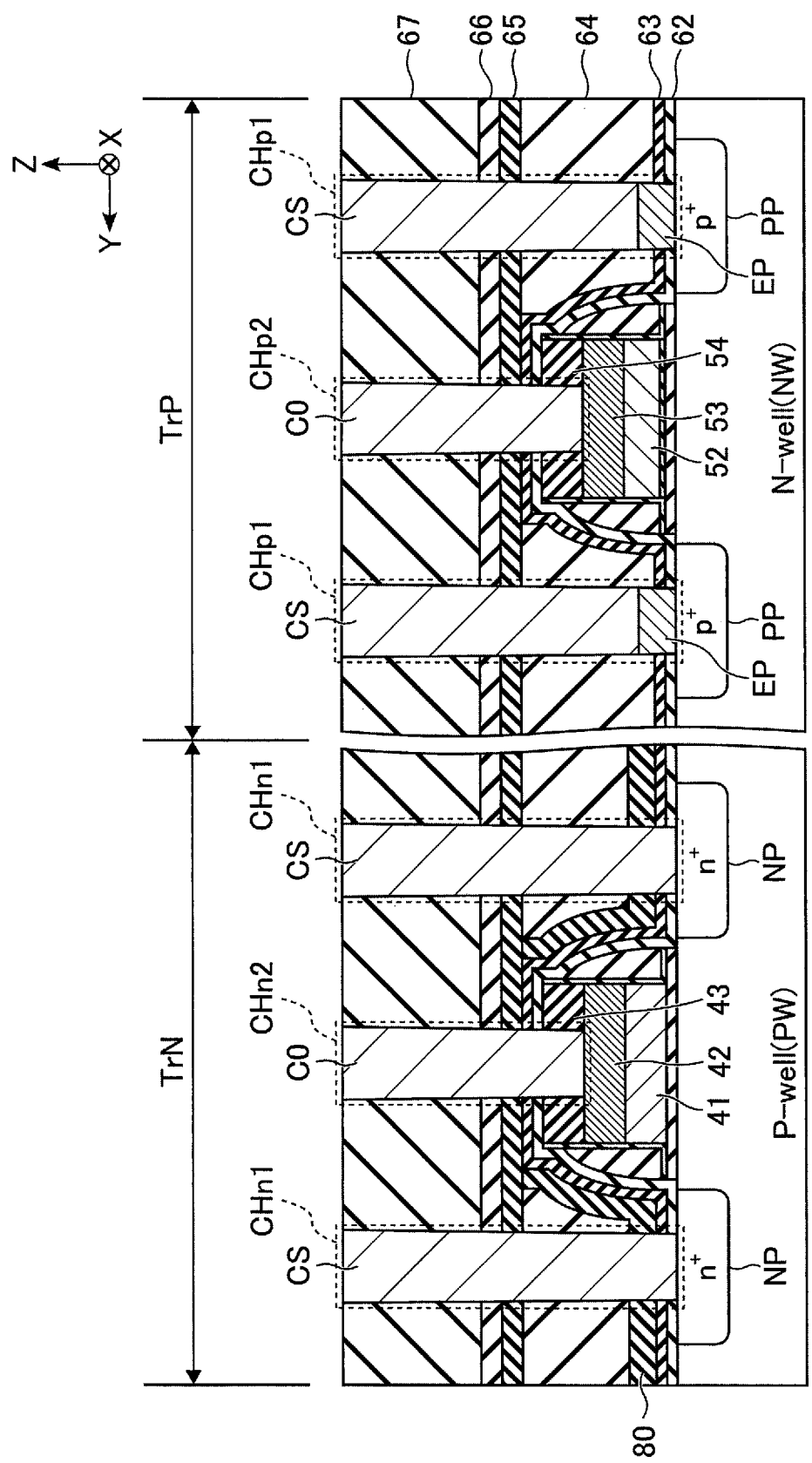

Next, as illustrated in FIG. 26, contacts CS and C0 corresponding to the NMOS transistor TrN and contacts CS and C0 corresponding to the PMOS transistor TrP are formed.

This manufacturing step is the same as the manufacturing step described with reference to FIG. 13 in the first embodiment.

As described above, in the manufacturing method of the semiconductor device 1 according to the second embodiment, the structure of the NMOS transistor TrN, which was described with reference to FIG. 16 in the second embodiment, and the structure of the PMOS transistor TrP, which was described with reference to FIG. 7 in the first embodiment, are formed.

In the manufacturing method of the semiconductor device 1 according to the second embodiment, the nitride film 80 in the PMOS transistor TrP may not completely be removed. It should suffice if the film thickness of the nitride film 80, which is processed in the manufacturing step described with reference to FIG. 20, is a film thickness which enables such a process that the surface of the p impurity diffusion region PP is exposed in the contact hole CHp1 and the n⁺ impurity diffusion region NP is not exposed in the contact hole CHn1 in the etching step described with reference to FIG. 23.

[2-3] Advantageous Effects of the Second Embodiment

In the semiconductor device 1 according to the second embodiment, the nitride film 80 is provided above the n⁺ impurity diffusion region NP corresponding to the NMOS transistor TrN. Specifically, the film thickness of the nitride film above the n+ impurity diffusion region NP is set to be greater than the film thickness of the nitride film above the p⁺ impurity diffusion region PP corresponding to the PMOS transistor TrP.

In addition, in the manufacturing method of the semiconductor device 1 according to the second embodiment, the contact holes CHn1 and CHn2 corresponding to the NMOS transistor TrN and the contact holes CHp1 and CHp2 corresponding to the PMOS transistor TrP are formed batch-wise by a single set of lithography and etching steps, before the epitaxial layers EP are formed.

In this etching step, by utilizing the difference in film thickness between the nitride films 63 and 80 provided above the impurity diffusion regions, the structure is formed in which the surface of the semiconductor is exposed only in the bottoms of the contact holes CHp1 in which epitaxial growth is performed, and the insulator is exposed in the bottoms of the contact holes CHn1, CHn2 and CHp2 in which epitaxial growth is not performed.

Furthermore, in the manufacturing method of the semiconductor device 1 according to the second embodiment, after the epitaxial layers EP are formed in the bottom portions of the contact holes CHp1, the etching is performed in the bottom portions of the contact holes CHn1, CHn2 and CHp2.

In this etching step, for example, anisotropic etching is performed by increasing the selectivity between the epitaxial layer EP in the bottom portion of each contact hole CHp1 and the insulator formed in the bottom portion of each of the other contact holes CHn1, CHn2 and CHp2.

Thereby, the structure is formed in which the n⁺ impurity diffusion regions NP are exposed in the bottoms of the contact holes CHn1, and the conductive layers 42 and 53 are exposed in the bottoms of the contact holes CHn2 and CHp2, respectively. Specifically, in this manufacturing step, there is no need to form a mask once again, and a lithography step can be omitted.

As described above, in the manufacturing method of the semiconductor device 1 according to the second embodiment, by the provision of the nitride film 80, the contact holes CHn1, CHn2 and CHp2 in which epitaxial layers are not formed, and the contact holes CHp1 in which the epitaxial layers EP are formed, can be formed by a single lithography step.

As a result, according to the manufacturing method of the semiconductor device 1 of the second embodiment, the number of times of lithography steps for forming the contact holes CHn1, CHn2, CHp1 and CHp2 can be made less than in the first embodiment. Therefore, the semiconductor device 1 of the second embodiment can simplify the manufacturing steps, and can reduce the manufacturing cost.

[3] Third Embodiment

In a semiconductor device 1 according to a third embodiment, a semiconductor layer similar to the epitaxial layer EP is provided in the bottom portion of each of the contacts CS and C0. Thereby, a decrease in performance of transistors provided on the semiconductor substrate 20 is suppressed. Hereinafter, as regards the semiconductor device 1 according to the third embodiment, different points from the first and second embodiments will be described.

[3-1] Configuration of Semiconductor Device 1

[3-1-1] Structure of NMOS Transistor TrN

FIG. 27 illustrates an example of a cross-sectional structure of an NMOS transistor TrN under the memory cell array 10 in the semiconductor device 1 according to the third embodiment.

As illustrated in FIG. 27, the region including the NMOS transistor TrN in the third embodiment has, for example, such a structure that the insulating layer 43 is replaced with a semiconductor layer 44, and epitaxial layers EpN1 and EpN2 are added in the structure described with reference to FIG. 6 in the first embodiment.

The semiconductor layer 44 is provided, for example, on the conductive layer 42. A side surface of the semiconductor layer 44 is covered with the oxide film 60. A part of the top surface of the semiconductor layer 44 is covered with the oxide film 62. The semiconductor layer 44 is an N-type semiconductor, and is, for example, polycrystalline silicon which is doped with phosphorus (P).

The epitaxial layer EpN1 is provided in a columnar shape on each of the $n^+$ impurity diffusion regions NP1 and NP2. A top surface of the epitaxial layer EpN1 is included, for example, in a layer above the layer provided with the nitride film 63, and is in contact with the contact CS.

The epitaxial layer EpN2 is provided in a columnar shape on the semiconductor layer 44. A top surface of the epitaxial layer EpN2 is included, for example, in a layer above the layer provided with the nitride film 65, and is in contact with the contact C0.

Each of the epitaxial layers EpN1 and EpN2 is a single-crystal semiconductor which is formed by epitaxial growth. Each of the epitaxial layers EpN1 and EpN2 is, for example, silicon (Si) which is doped with phosphorus.

Aside from this, it should suffice if, at the least, each of the epitaxial layers EpN1 and EpN2 can electrically connect between the contact CS and the impurity diffusion region NP and between the contact C0 and the semiconductor layer 44, and each epitaxial layer may be designed to have a freely selected layer structure.

In addition, in the third embodiment, the epitaxial layer EpN1 may be formed such that, at the least, the contact CS is not in contact with the oxide film 62.

Similarly, in the third embodiment, the epitaxial layer EpN2 may be formed such that, at the least, the contact C0 does not come in contact with the oxide film 62.

[3-1-2] Structure of PMOS Transistor TrP

FIG. 28 illustrates an example of a cross-sectional structure of a PMOS transistor TrP under the memory cell array 10 in the semiconductor device 1 according to the third embodiment.

As illustrated in FIG. 28, the region including the PMOS transistor TrP in the third embodiment has, for example, such a structure that the insulating layer 54 is replaced with a semiconductor layer 55, and epitaxial layers EpP1 and EpP2 are added in the structure described with reference to FIG. 7 in the first embodiment.

The semiconductor layer 55 is provided, for example, on the conductive layer 53. A side surface of the semiconductor layer 55 is covered with the oxide film 60. A part of the top surface of the semiconductor layer 55 is covered with the oxide film 62. The semiconductor layer 55 is a P-type semiconductor, and is, for example, polycrystalline silicon which is doped with boron.

The epitaxial layer EpP1 is provided in a columnar shape on each of the $p^+$ impurity diffusion regions PP1 and PP2. A top surface of the epitaxial layer EpP1 is included, for example, in a layer above the layer provided with the nitride film 63, and is in contact with the contact CS.

The epitaxial layer EpP2 is provided in a columnar shape on the semiconductor layer 55. A top surface of the epitaxial layer EpP2 is included, for example, in a layer above the layer provided with the nitride film 65, and is in contact with the contact C0.

Each of the epitaxial layers EpP1 and EpP2 is formed by epitaxial growth. Each of the epitaxial layers EpP1 and EpP2 has, for example, the same layer structure as the epitaxial layer EP described in the first embodiment.

Aside from this, it should suffice if, at the least, each of the epitaxial layers EpP1 and EpP2 can electrically connect between the contact CS and the impurity diffusion region PP and between the contact C0 and the semiconductor layer 55, and each epitaxial layer may be designed to have a freely selected layer structure.

In the third embodiment, the epitaxial layer EpP1 may be formed such that, at the least, the contact CS is not in contact with the oxide film 62. Similarly, in the third embodiment, the epitaxial layer EpP2 may be formed such that, at the least, the contact C0 does not come in contact with the oxide film 62.

Since the other structure of the semiconductor device 1 according to the above-described third embodiment is the same as the structure of the semiconductor device 1 according to the first embodiment, a description thereof omitted.

[3-2] Manufacturing Method of Semiconductor Device 1

Hereinafter, referring to FIG. 29 to FIG. 34, a description is given of an example of a series of manufacturing steps from the formation of the NMOS transistor TrN and PMOS transistor TrP to the formation of the contacts CS and C0 in the third embodiment.

Each of FIG. 29 to FIG. 34 illustrates an example of the cross-sectional structure including the structure corresponding to the NMOS transistor TrN and PMOS transistor TrP in the manufacturing steps of the semiconductor device 1 according to the third embodiment.

To begin with, as illustrated in FIG. 29, the NMOS transistor TrN and PMOS transistor TrP are formed. The structure illustrated in FIG. 29 is the same as the structure in which the insulating layer 43 in the NMOS transistor TrN is replaced with the semiconductor layer 44 and the insulating layer 54 in the PMOS transistor TrP is replaced with the semiconductor layer 55 in the structure described with reference to FIG. 9 in the first embodiment.

Figure 30:
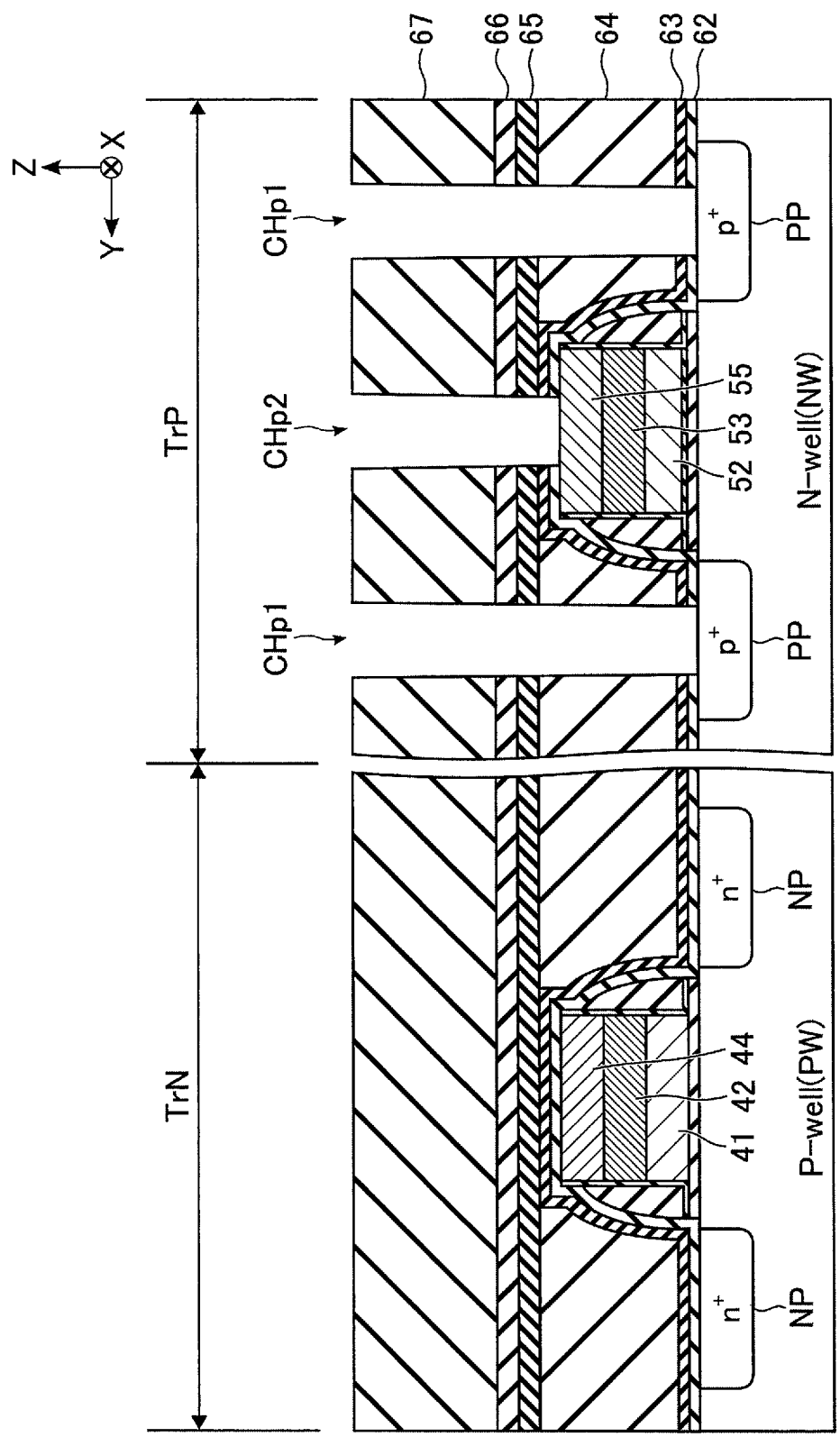

Next, as illustrated in FIG. 30, contact holes CHp1 and CHp2 corresponding to the contacts CS and C0 of the PMOS transistor TrP are formed. As an etching method in this manufacturing step, for example, anisotropic etching such as reactive ion etching (RIE) is used.

In this manufacturing step, the contact hole CHp1 penetrates the insulator 67, oxide film 66, nitride film 65, insulator 64, nitride film 63 and oxide film 62. In addition, the surface of the p impurity diffusion region PP is exposed at a bottom portion of the contact hole CHp1.

The contact hole CHp2 penetrates the insulator 67, oxide film 66, nitride film 65, nitride film 63 and oxide film 62. In addition, the surface of the conductive layer 55 is exposed at a bottom portion of the contact hole CHp2.

Figure 31:
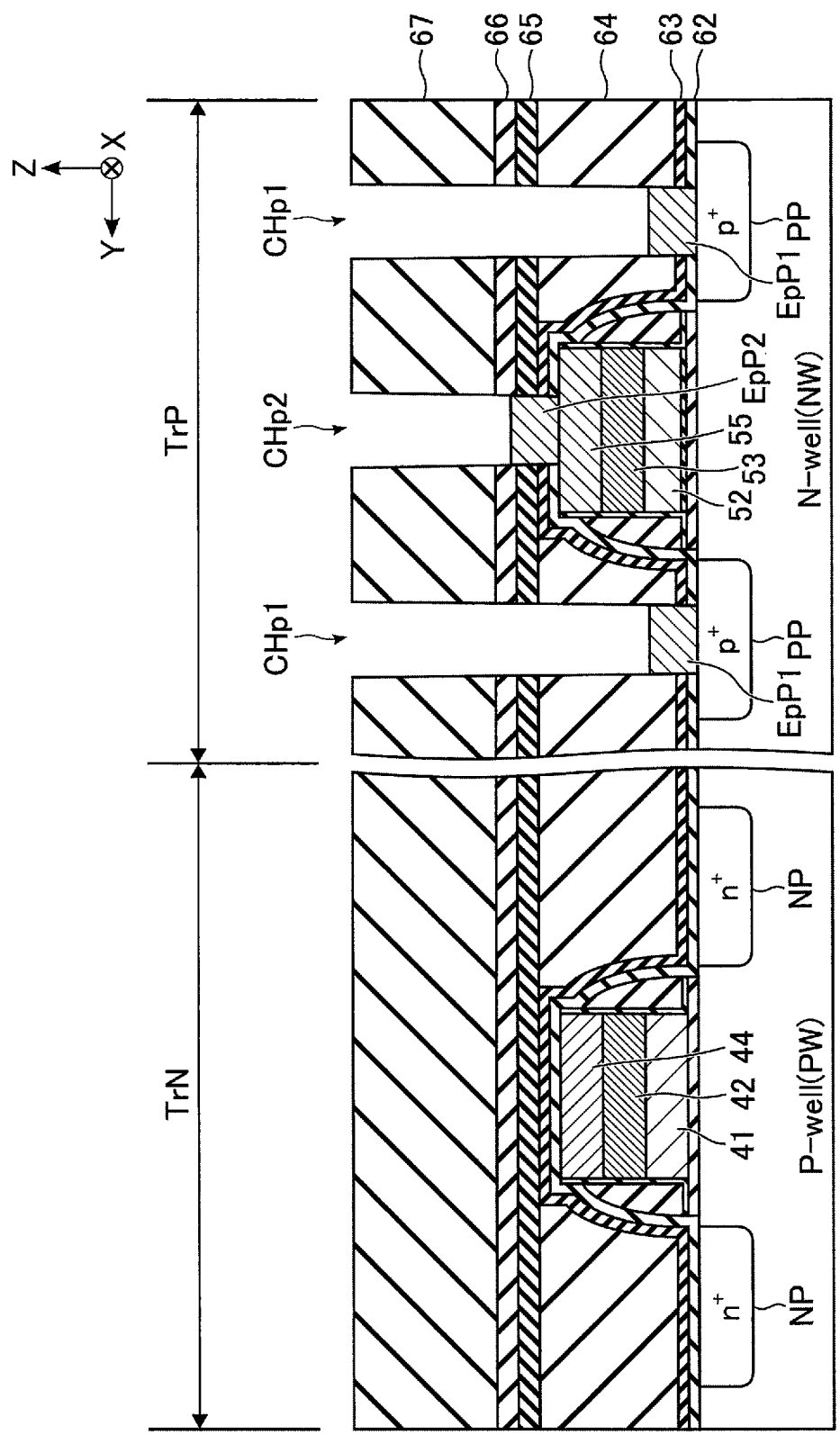

Next, as illustrated in FIG. 31, epitaxial layers EpP1 and EpP2 are formed in bottom portions of the contact holes CHp1 and CHp2. Concretely, for example, epitaxial growth is performed based on silicon (Si) in the N-well region NW, and single-crystal silicon is formed on the top surface of the $p^+$ impurity diffusion region PP. In addition, epitaxial growth is performed based on silicon (Si) in the semiconductor layer 55, and polycrystalline silicon is formed on the top surface of the semiconductor layer 55.

For example, in this manufacturing step, the epitaxial layer EpP1 is formed such that the top surface thereof reaches a layer above the nitride film 63, and the epitaxial layer EpP2 is formed such that the top surface thereof reaches a layer above the nitride film 65.

Next, as illustrated in FIG. 32, contact holes CHn1 and CHn2 corresponding to the contacts CS and C0 of the NMOS transistor TrN are formed. As an etching method in this manufacturing step, for example, anisotropic etching such as RIE is used.

In this manufacturing step, the contact hole CHn1 penetrates the insulator 67, oxide film 66, nitride film 65, insulator 64, nitride film 63 and oxide film 62. In addition, the surface of the $n^+$ impurity diffusion region NP is exposed at a bottom portion of the contact hole CHn1.

The contact hole CHn2 penetrates the insulator 67, oxide film 66, nitride film 65, nitride film 63 and oxide film 62. In addition, the surface of the conductive layer 44 is exposed at a bottom portion of the contact hole CHn2.

Next, as illustrated in FIG. 33, epitaxial layers EpN1 and EpN2 are formed in bottom portions of the contact holes CHn1 and CHn2. Concretely, for example, epitaxial growth is performed based on silicon (Si) in the P-well region PW, and single-crystal silicon is formed on the top surface of the $n^+$ impurity diffusion region NP. In addition, epitaxial growth is performed based on silicon (Si) in the semiconductor layer 44, and polycrystalline silicon is formed on the top surface of the semiconductor layer 44.

For example, in this manufacturing step, the epitaxial layer EpN1 is formed such that the top surface thereof reaches a layer above the nitride film 63, and the epitaxial layer EpN2 is formed such that the top surface thereof reaches a layer above the nitride film 65.

Next, as illustrated in FIG. 34, contacts CS and C0 corresponding to the NMOS transistor TrN and contacts CS and C0 corresponding to the PMOS transistor TrP are formed. This manufacturing step is the same as the manufacturing step described with reference to FIG. 13 in the first embodiment.

As a result, the contact CS having the bottom surface put in contact with the epitaxial layer EpN1 is formed in the contact hole CHn1. The contact C0 having the bottom surface put in contact with the epitaxial layer EpN2 is formed in the contact hole CHn2.

The contact CS having the bottom surface put in contact with the epitaxial layer EpP1 is formed in the contact hole CHp1. The contact C0 having the bottom surface put in contact with the epitaxial layer EpP2 is formed in the contact hole CHp2.

As described above, in the manufacturing method of the semiconductor device 1 according to the third embodiment, the structure of the NMOS transistor TrN, which was described with reference to FIG. 27, and the structure of the PMOS transistor TrP, which was described with reference to FIG. 28, are formed.

[3-3] Advantageous Effects of the Third Embodiment

In the semiconductor device in which a circuit such as a sense amplifier module is disposed under the memory cell array, it is possible that, in the heat treatment at the time of forming the memory cell array, impurities (e.g. hydrogen), which occur from the structure corresponding to the memory cell array, adversely affects the circuit under the memory cell array.

As a countermeasure to this, in the semiconductor device 1, the barrier layer BaL is provided under the memory cell array 10. If the barrier layer BaL is provided, it is possible to prevent hydrogen, which occurs in a layer above the barrier layer BaL, from entering the circuit under the memory cell array.

On the other hand, in the case where the barrier layer BaL is provided under the memory cell array 10, hydrogen included in an interlayer insulating film (e.g. TEOS) formed under the barrier layer BaL is in a state of confinement between the semiconductor substrate 20 and barrier layer BaL.

If the heat treatment at the time of forming the memory cell array is performed in this structure, the hydrogen in the interlayer insulating film under the barrier layer BaL is heated in the state of confinement between the semiconductor substrate 20 and barrier layer BaL. Then, it is possible that the hydrogen heated between the semiconductor substrate 20 and barrier layer BaL enters, and diffuses into, the semiconductor substrate 20 via the contact CS or C0. Such hydrogen may become a factor of characteristic degradation of the transistors.

Thus, in the semiconductor device 1 according to the third embodiment, the epitaxial layers EpN1, EpN2, EpP1 and EpP2 are formed under the contacts CS and C0 corresponding to the NMOS transistor TrN and under the contacts CS and C0 corresponding to the PMOS transistor TrP.

These epitaxial layers EpN1, EpN2, EpP1 and EpP2 are formed such that each of the contacts CS and C0 is not in contact with the oxide film 62. Specifically, in the semiconductor device 1 according to the third embodiment, the nitride film 63 and epitaxial layers EpN1, EpN2, EpP1 and EpP2 shut off, for example, the path of hydrogen which enters the semiconductor substrate 20 from the insulator 67 through the contact CS or C0.

Thereby, in the semiconductor device 1 according to the third embodiment, in the heat treatment at the time of forming the memory cell array, it is possible to prevent the hydrogen, which is included in the interlayer insulating film under the barrier layer BaL, from entering, and diffusing into, the semiconductor substrate 20 via the contacts CS and C0. Therefore, the semiconductor device 1 according to the third embodiment can suppress degradation in performance of the transistors.

[3-4] Modifications of the Third Embodiment

In the semiconductor device 1 according to the third embodiment, the case was illustrated in which the semiconductor layer 44 and epitaxial layer EpN2 are provided in association with the NMOS transistor TrN, and the semiconductor layer 55 and epitaxial layer EpP2 are provided in association with the PMOS transistor TrP. However, the third embodiment is not limited to this case.

For example, the semiconductor layer 55 and epitaxial layer EpP2 may be provided in place of the semiconductor layer 44 and epitaxial layer EpN2 corresponding to the NMOS transistor TrN. Similarly, the semiconductor layer 44 and epitaxial layer EpN2 may be provided in place of the semiconductor layer 55 and epitaxial layer EpP2 corresponding to the PMOS transistor TrP.

Specifically, each of the semiconductor provided on the conductive layer 42 and the semiconductor provided on the conductive layer 53 may be an N-type semiconductor or a P-type semiconductor. In this case, in the manufacturing process of the semiconductor device 1, epitaxial growth via the contract hole CHn2 or CHp2 is performed as appropriate.

In addition, in the semiconductor device 1 according to the third embodiment, the case was illustrated in which the epitaxial layers EpN1, EpN2, EpP1 and EpP2 are used in order to prevent the entrance of impurities into the semiconductor substrate 20. However, polycrystalline silicon may be used in place of the epitaxial layers EpN1, EpN2, EpP1 and EpP2.

In this case, for example, in the manufacturing step described with reference to FIG. 31 in the third embodiment, polycrystalline silicon doped with boron, for instance, is formed, and semiconductor layers that are provided in place of the epitaxial layers EpP1 and EpP2 are processed to a desired height by etch-back.

Similarly, in the manufacturing step described with reference to FIG. 33, polycrystalline silicon doped with phosphorus, for instance, is formed, and semiconductor layers that are provided in place of the epitaxial layers EpN1 and EpN2 are processed to a desired height by etch-back. The other manufacturing steps are the same as the manufacturing steps described in the third embodiment.

When the polycrystalline silicon is formed in order to prevent the entrance of impurities, non-doped polycrystalline silicon may first be formed in the contact hole. In this case, after the non-doped polycrystalline silicon formed in the contact hole is etched back to a desired height, P-type impurities (e.g. boron) or N-type impurities (e.g. phosphorus) are doped in the polycrystalline silicon by ion implantation or the like.

Furthermore, in the case of the structure in which the polycrystalline silicon is used in order to prevent the entrance of impurities, the semiconductor layer 44 (polycrystalline silicon) may not be disposed on the topmost surface of the gate electrode of the NMOS transistor TrN, and the semiconductor layer 55 (polycrystalline silicon) may not be disposed on the topmost surface of the gate electrode of the PMOS transistor TrP.

In this case, in the semiconductor device 1, for example, the semiconductor layer 44 corresponding to the NMOS transistor TrN may be replaced with the insulating layer 43 described in the first embodiment, and the bottom portion of the polycrystalline silicon, which is provided in place of the epitaxial layer EpN2, may be configured to come in contact with the conductive layer 42.

Similarly, in the semiconductor device 1, for example, the semiconductor layer 55 corresponding to the PMOS transistor TrP may be replaced with the insulating layer 54 described in the first embodiment, and the bottom portion of the polycrystalline silicon, which is provided in place of the epitaxial layer EpP2, may be configured to come in contact with the conductive layer 53.

[4] Other Modifications, Etc

A semiconductor device according to an embodiment includes an N-well region, a first gate electrode, a columnar epitaxial layer, and a first contact. The N-well region includes two P-type impurity diffusion regions. The first gate electrode is provided above the N-well region between the two P-type impurity diffusion regions. The first gate electrode is opposed to the N-well region via a gate insulating film. The columnar epitaxial layer is provided on at least one of the two P-type impurity diffusion regions. The epitaxial layer includes a first semiconductor layer including P-type impurities. The first contact is provided on the first semiconductor layer of the epitaxial layer. Thereby, in the semiconductor device according to the embodiment, the variation in characteristic of transistors can be suppressed.

The manufacturing steps described in the above-described embodiments are merely examples, and other processes may be inserted between the manufacturing steps, and the manufacturing steps may be interchanged as appropriate. Any manufacturing steps may be applied as the manufacturing steps of the semiconductor device 1, if the structures described in the above embodiments can be formed.

For example, in the manufacturing steps of the semiconductor device 1 described in the second embodiment, the nitride film 80 may be formed after the $p^+$ impurity diffusion region PP and $n^4$ impurity diffusion region NP are formed. In this manner, in the second embodiment, the manufacturing steps prior to the manufacturing step described with reference to FIG. 22 can be changed as appropriate.

In the above embodiments, the case was illustrated in which the nitride film is used as an etching stopper at the time of forming the contact holes corresponding to the impurity diffusion regions, but the embodiments are not limited to this. Other materials may be used in place of the nitride films 63 and 80 if the materials are usable as the etching stopper.

In the manufacturing steps described in the above embodiments, the case was illustrated in which the semiconductor layer doped with impurities is formed at the time of epitaxial growth, but the embodiments are not limited to this. For example, after a non-doped semiconductor layer is formed by epitaxial growth, the semiconductor layer may be doped with impurities.

For example, an oxide film may be formed after a non-doped epitaxial layer EP is formed, and impurities may be doped in the non-doped epitaxial layer EP by executing an ion implantation process at a high concentration via this oxide film.

In the above embodiments, the contacts CS and C0 and the epitaxial layers EP were described separately. However, the epitaxial layers EP may be regarded as parts of the contacts CS and C0. For example, in the first embodiment, the contact CS corresponding to the PMOS transistor TrP may be regarded as including the conductors 70 and 71 formed of metals, and the semiconductor layers 72 and 73 formed by epitaxial growth.

In the above embodiments, the structure of the memory cell array 10 may be a different structure. For example, the memory pillar MP may have such a structure that a plurality of pillars are coupled in the Z direction. For example, the memory pillar MP may have such a structure that a pillar penetrating the conductors 24 (select gate lines SGD) and a pillar penetrating the conductors 23 (word lines WL) are coupled. Besides, the memory pillar MP may have such a structure that a plurality of pillars, which penetrate the conductors 23, respectively, are coupled in the Z direction.

In the above embodiments, the semiconductor device 1, in which the memory cell array 10 is formed on the circuit that is formed on the semiconductor substrate 20, was illustrated. However, the structure of each of the NMOS transistor TrN and PMOS transistor TrP described in each embodiment is also applicable to other semiconductor devices. Specifically, the purpose of use of the semiconductor device including the structures of the NMOS transistor TrN and PMOS transistor TrP is not limited to semiconductor memories.

In the present specification, the term "connection" means an electrical connection, and does not exclude a connection with another element being interposed.

In the present specification, the term "conductivity type" means an N type or a P type. For example, a first conductivity type corresponds to the P type, and a second conductivity type corresponds to the N type.

In the present specification, the term "N-type impurity diffusion region" corresponds to the n$^+$ impurity diffusion region NP, and "P-type impurity diffusion region" corresponds to the p$^+$ impurity diffusion region PP.

In the present specification, the expression "columnar" refers to a structure formed in the contact hole. Thus, in this specification, for example, regardless of the height of the epitaxial layer EP, this epitaxial layer EP is regarded as being "columnar".

In the present specification, the expression "top surfaces are aligned" means that the distances in the Z direction between the surface of the semiconductor substrate 20, for instance, and certain structural elements are substantially equal between these target structural elements. In addition, the expression "top surfaces are aligned" may also mean that, for example, the top surface of a first structural element and the top surface of a second structural element are in contact with an identical interconnect layer or insulating layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    an N-well region including two P-type impurity diffusion regions;
    a first gate electrode above the N-well region between the two P-type impurity diffusion regions, the first gate electrode being opposed to the N-well region via a gate insulating film;
    a columnar epitaxial layer on at least one of the two P-type impurity diffusion regions, the epitaxial layer including a first semiconductor layer including P-type impurities; and
    a first contact on the first semiconductor layer of the epitaxial layer, wherein
    the first semiconductor layer further includes carbon, and
    a carbon concentration in the first semiconductor layer is $10^{19}$ (atoms/cm$^3$) or more.

2. The device of claim 1, wherein
    the first semiconductor layer includes boron as the P-type impurities, and
    a boron concentration in the first semiconductor layer is $10^{19}$ (atoms/cm$^3$) or more.

3. The device of claim 1, wherein
    the epitaxial layer further includes a second semiconductor layer between the at least one of the two P-type impurity diffusion regions and the first semiconductor layer,
    each of the second semiconductor layer and the at least one of the two P-type impurity diffusion regions includes boron, and
    a boron concentration in the second semiconductor layer is equal to or less than a boron concentration in the at least one of the two P-type impurity diffusion regions.

4. The device of claim 3, wherein
    the epitaxial layer further includes a third semiconductor layer between the first semiconductor layer and the second semiconductor layer,
    the first semiconductor layer includes boron as the P-type impurities, and
    the third semiconductor layer includes carbon.

5. The device of claim 1, wherein
    the first semiconductor layer includes boron as the P-type impurities,
    and
    the first semiconductor layer of the epitaxial layer is in contact with the at least one of the two P-type impurity diffusion regions.

6. The device of claim 5, wherein
    a boron concentration in the first semiconductor layer is $10^{19}$ (atoms/cm$^3$) or more.

7. The device of claim 1, wherein the first contact is formed of a metal.

8. The device of claim 1, further comprising:
    a P-well region including two N-type impurity diffusion regions;
    a second gate electrode above the P-well region between the two N-type impurity diffusion regions, the second gate electrode being opposed to the P-well region via a gate insulating film; and
    a second contact on at least one of the two N-type impurity diffusion regions, no columnar epitaxial layer being included between the second contact and the at least one of the two N-type impurity diffusion regions.

9. The device of claim 8, further comprising:
    a first insulating film including a first portion formed above the at least one of the two P-type impurity diffusion regions, and a second portion extending along a side wall of the first gate electrode, the first contact or the columnar epitaxial layer passing through the first portion of the first insulating film, and the first portion and the second portion of the first insulating film being continuously provided; and
    a second insulating film including a first portion formed above the at least one of the two N-type impurity diffusion regions, and a second portion extending along a side wall of the second gate electrode, the second contact passing through the first portion of the second insulating film, the first portion and the second portion of the second insulating film being continuously provided, and the second insulating film being thicker than the first insulating film.

10. The device of claim 9, wherein
    each of the first insulating film and the second insulating film includes silicon nitride.

11. The device of claim 1, further comprising:
    a multilayer body provided in a layer above a top surface of the first contact, the multilayer body including alternately stacked insulating layers and conductive layers; and
    a plurality of pillars each penetrating the multilayer body, intersection portions between the pillars and the conductive layers functioning as memory cells.

12. A semiconductor device comprising:
a second conductivity-type well region including two first conductivity-type impurity diffusion regions;
a first gate electrode above the second conductivity-type well region between the two first conductivity-type impurity diffusion regions, the first gate electrode being opposed to the second conductivity-type well region via a gate insulating film;
a first oxide film continuously provided above at least one of the two first conductivity-type impurity diffusion regions and above the first gate electrode;
a first nitride film on the first oxide film, the first nitride film being continuously provided above the at least one of the two first conductivity-type impurity diffusion regions and above the first gate electrode;
a columnar first semiconductor on the at least one of the two first conductivity-type impurity diffusion regions, the columnar first semiconductor including a portion through the first oxide film;
a columnar second semiconductor on the first gate electrode, the columnar second semiconductor including a portion through the first oxide film;
a first contact on the columnar first semiconductor; and
a second contact on the columnar second semiconductor.

13. The device of claim 12, wherein the first contact and the second contact have no portion which is in contact with the first oxide film.

14. The device of claim 12, wherein
the first gate electrode includes a polycrystalline silicon layer which is in contact with the columnar second semiconductor.

15. The device of claim 14, wherein
each of the columnar first semiconductor and the columnar second semiconductor is formed by epitaxial growth.

16. The device of claim 12, wherein each of the columnar first semiconductor and the columnar second semiconductor is polycrystalline silicon.

17. The device of claim 12, wherein
each of the first contact and the second contact is formed of a metal.

18. The device of claim 12, further comprising:
a first conductivity-type well region including two second conductivity-type impurity diffusion regions;
a second gate electrode above the first conductivity-type well region between the two second conductivity-type impurity diffusion regions, the second gate electrode being opposed to the first conductivity-type well region via a gate insulating film;
a second oxide film continuously provided above at least one of the two second conductivity-type impurity diffusion regions and above the second gate electrode;
a second nitride film on the second oxide film, the second nitride film being continuously provided above the at least one of the two second conductivity-type impurity diffusion regions and above the second gate electrode;
a columnar third semiconductor on the at least one of the two second conductivity-type impurity diffusion regions, the third semiconductor including a portion through the second oxide film;
a columnar fourth semiconductor on the second gate electrode, the fourth semiconductor including a portion through the second oxide film;
a third contact on the columnar third semiconductor; and
a fourth contact on the columnar fourth semiconductor.

19. The device of claim 12, further comprising:
a multilayer body provided in a layer above a top surface of each of the first contact and the second contact, the multilayer body including alternately stacked insulating layers and conductive layers; and
a plurality of pillars each penetrating the multilayer body, intersection portions between the pillars and the conductive layers functioning as memory cells.

20. A semiconductor device comprising:
an N-well region including two P-type impurity diffusion regions;
a first gate electrode above the N-well region between the two P-type impurity diffusion regions, the first gate electrode being opposed to the N-well region via a gate insulating film;
a columnar epitaxial layer on at least one of the two P-type impurity diffusion regions, the epitaxial layer including a first semiconductor layer including P-type impurities; and
a first contact on the first semiconductor layer of the epitaxial layer, wherein
the first semiconductor layer includes boron as the P-type impurities,
the first semiconductor layer further includes carbon, and
the first semiconductor layer of the epitaxial layer is in contact with the at least one of the two P-type impurity diffusion regions.

21. The device of claim 20, wherein
a boron concentration in the first semiconductor layer is $10^{19}$ (atoms/cm$^3$) or more, and
a carbon concentration in the first semiconductor layer is $10^{19}$ (atoms/cm$^3$) or more.

22. The device of claim 20, wherein the first contact is formed of a metal.

23. The device of claim 20, further comprising:
a P-well region including two N-type impurity diffusion regions;
a second gate electrode above the P-well region between the two N-type impurity diffusion regions, the second gate electrode being opposed to the P-well region via a gate insulating film; and
a second contact on at least one of the two N-type impurity diffusion regions, no columnar epitaxial layer being included between the second contact and the at least one of the two N-type impurity diffusion regions.

24. The device of claim 23, further comprising:
a first insulating film including a first portion formed above the at least one of the two P-type impurity diffusion regions, and a second portion extending along a side wall of the first gate electrode, the first contact or the columnar epitaxial layer passing through the first portion of the first insulating film, and the first portion and the second portion of the first insulating film being continuously provided; and
a second insulating film including a first portion formed above the at least one of the two N-type impurity diffusion regions, and a second portion extending along a side wall of the second gate electrode, the second contact passing through the first portion of the second insulating film, the first portion and the second portion of the second insulating film being continuously provided, and the second insulating film being thicker than the first insulating film.

25. The device of claim 24, wherein
each of the first insulating film and the second insulating film includes silicon nitride.

26. The device of claim 20, further comprising:
a multilayer body provided in a layer above a top surface of the first contact, the multilayer body including alternately stacked insulating layers and conductive layers; and
a plurality of pillars each penetrating the multilayer body, intersection portions between the pillars and the conductive layers functioning as memory cells.

* * * * *